United States Patent [19]
Koyama et al.

[11] Patent Number: 5,786,713
[45] Date of Patent: Jul. 28, 1998

[54] DRIVER CIRCUIT AND A METHOD FOR GENERATING A DRIVING SIGNAL

[75] Inventors: Eiji Koyama, Nara; Takashi Watanabe, Soraku-gun, both of Japan

[73] Assignee: Sharp, Kabushiki, Kaisha, Osaka, Japan

[21] Appl. No.: 651,727

[22] Filed: May 22, 1996

[30] Foreign Application Priority Data

May 23, 1995 [JP] Japan ................................. 7-123992
Mar. 15, 1996 [JP] Japan ................................. 8-059853

[51] Int. Cl.⁶ ........................................................ H03K 5/08
[52] U.S. Cl. ............................................ 327/108; 327/309
[58] Field of Search ................................. 327/108, 333, 327/313, 319, 321, 309, 314, 320, 327; 326/82, 83

[56] References Cited

U.S. PATENT DOCUMENTS 4,967,099 10/1990 Mori ......................................... 327/321
5,266,848 11/1993 Nakagome et al. ..................... 327/306

FOREIGN PATENT DOCUMENTS 5-103272 4/1993 Japan.
5-260397 8/1993 Japan.

Primary Examiner—Timothy P. Callahan
Assistant Examiner—Eunja Shin
Attorney, Agent, or Firm—David G. Conlin; William J. Daley, Jr.

[57] ABSTRACT

A driver circuit for generating a driving pulse signal having a plurality of levels using a supply voltage of a first polarization based on input timing signals. The driver circuit includes a circuit for generating a first voltage from the supply voltage; a first amplitude modulator for amplifying one of the input timing signals using the first voltage, thereby generating a modulated signal having levels of the first voltage and a grounded voltage; and a clamping circuit for clamping the modulated signal so as to shift the grounded voltage level of the modulated signal to a second voltage level having a second polarization opposite to the first polarization, thereby generating a pulse signal having the second voltage level and an amplitude substantially the same as that of the modulated signal.

19 Claims, 24 Drawing Sheets

PRIOR ART

5,786,713

DRIVER CIRCUIT AND A METHOD FOR GENERATING A DRIVING SIGNAL

BACKGROUND OF THE INVENTION

1. Field of the Invention

The present invention relates to a driver circuit and a method for generating a multi-pulse signal. More particularly, the present invention relates to a driver circuit for driving a CCD type solid-state camera device and a method for generating a multi-pulse driving signal for a CCD type solid-state camera device.

2. Description of the Related Art

Charge-coupled device (CCD) type solid-state camera devices have been widely used for various camera systems such as video cameras, surveillance cameras, monitor cameras, videophone cameras, and the like. FIG. 1 shows an exemplary structure of a conventional CCD solid-state camera device 100. As shown in FIG. 1, the CCD solid-state camera device 100 includes, photo-diodes 101 in a photo detecting section which receive light and transform the light into photoelectric charges. Vertical CCDs 102 receive the photoelectric charges from the photo-diodes 101 and transfer the charges to a horizontal CCD 103. The horizontal CCD 103 receives the photoelectric charges from the vertical CCDs 102 so as to transfer and output such charges as a video signal.

The photoelectric charges in each of the photo-diodes 101 are transferred to the corresponding vertical CCDs 102 simultaneously. The charges which are read into the vertical CCDs 102 are sequentially transferred to the horizontal CCD 103 in a row-by-row manner according to four-phase pulse signals which are applied to the corresponding terminals $v_1$-$v_4$. The charges in the horizontal CCD 103 are transferred serially according to two-phase pulse signals applied to the corresponding terminals $h_1$ and $h_2$, and are output through an output gate 104.

FIG. 2 shows an example of the four-phase pulse signals $\phi V_1$-$\phi V_4$ for driving the vertical CCDs 102. As shown in FIG. 2, the driving pulse signals $\phi V_2$ and $\phi V_4$ are binary voltage signals having two levels: a negative level ($-V_L$) and a zero level (0), while the driving pulse signals $\phi V_1$ and $\phi V_3$ are a trinary voltage signal having three levels: a positive level ($V_H$), a negative level ($-V_L$), and an intermediate level (0). Values of the levels $-V_L$ and $V_H$ are usually set at about $-10V$ and $15V$, respectively. The intermediate level may be set within the threshold voltage of read-out gates (not shown) from the photo-diodes 101 to the vertical CCDs 102, i.e., 0V to about 1V, though 0V is usually used as a matter of convenience for circuitry design.

In general, charge transfer in the vertical CCDs 102 is performed by supplying pulse voltage signals to transfer gates (not shown) in each vertical CCD 102, the pulse voltage signals having peaks at negative and zero levels. More specifically, as shown in FIG. 2, each vertical CCD 102 is driven by respective two-level portions of the driving pulse signals $\phi V_1$-$\phi V_4$ having peaks at the negative ($-V_L$) and zero (0) levels, so as to transfer the electric charges therein. A time period in which the driving pulse signals $\phi V_1$-$\phi V_4$ have the respective two-level portions is referred to as a transfer period, as shown in FIG. 2.

Charge transfer from the photo-diode 101 to the corresponding vertical CCDs 102 is performed by applying pulse voltage signals having a positive level to the read-out gates between the photo-diode 101 and the corresponding vertical CCDs 102. More specifically, as shown in FIG. 2, photo-electric charges in the photo-diodes 101 are read out by supplying the read-out gates with respective positive level ($V_H$) portions of the driving pulse signals $\phi V_1$ and $\phi V_3$. A time period in which the driving pulse signals $\phi V_1$ and $\phi V_3$ have the respective positive level is referred to as a read-out period, as shown in FIG. 2.

As will be appreciated, the driving pulse signals $\phi V_2$ and $\phi V_4$ are used only for transferring electric charges through the vertical CCDs 102, while the driving pulse signals $\phi V_1$ and $\phi V_3$ are used both for reading the photoelectric charges from the photo-diodes 101 to the vertical CCDs 102, and for transferring electric charges through the vertical CCDs 102.

The reasons why electric charges in the vertical CCDs 102 are transferred using a negative voltage level are as follows:

If the electric charges in the vertical CCDs 102 are transferred using a positive voltage level, photo-electric charges stored in the photo-diodes 101 leak into the vertical CCDs 102 since the threshold voltage of the read-out gates is about 0V to 1V. Thus, a negative-level signal is used for driving the vertical CCDs 102 in order to prevent the photoelectric charges in the photo-diodes 101 from leaking through the read-out gates. In addition, holes are built up in boundaries of the bulk (semiconductor layer) and oxide films in the vertical CCDs 102 in order to prevent dark currents from flowing in the boundaries of the bulk and oxide films. This requires the driving pulse signals applied to the vertical CCDs 102 to have a negative level.

As shown in FIG. 3, the CCD solid-state camera device 100 is driven by the driving pulse signals $\phi V_1$-$\phi V_4$ applied from a driver circuit 120 (for example, see Japanese Laid-Open Patent Publication No. 5-103237). The driver circuit 120 generates the driving pulse signals $\phi V_1$-$\phi V_4$ having peaks at predetermined levels, using positive ($V_H$) and negative ($-V_L$) direct voltages which are applied from a power supply 160, based on timing pulse signals $V_1$-$V_4$ and TG which are supplied from a timing circuit 140 included in a peripheral IC.

The timing circuit 140 generates the timing pulse signals $V_1$-$V_4$ for driving the vertical CCDs 102 and the timing pulse signal TG for reading photoelectric charges from the photo-diodes 110. The timing pulse signals typically have peaks at logic voltage levels of 0V and 5V. FIG. 4 shows an example of the timing pulse signals $V_1$-$V_4$ and TG. As shown in FIG. 4, the timing pulse signal TG goes high (at a H-level of 5V) in the read-out period in which photoelectric charges are read from the photo-diodes 101. The timing pulse signal TG goes low (at a L-level of 0V) in the transfer period in which electric charges are transferred through the vertical CCDs 102. The pulses of the timing pulse signals $V_1$-$V_4$ are respectively configured in a different phase during the transfer period so that the electric charges are transferred through the vertical CCDs 102 by the driving pulse signals $\phi V_1$-$\phi V_4$ applied to the corresponding transfer electrodes (not shown).

Referring back to FIG. 3, the driver circuit 120 transforms the timing pulse signals $V_1$-$V_4$ and TG, which have respective logic levels of 0V and 5V, into the driving pulse signals $\phi V_1$-$\phi V_4$ which have the predetermined voltage levels required for driving the vertical CCDs 102. The driver circuit 120 is typically referred to as a V-driver. As appreciated from FIGS. 2 and 4, the timing pulse signals $V_1$-$V_4$ correspond to the driving pulse signals $\phi V_1$-$\phi V_4$, and read-out pulses (H-level) of the timing signal TG are converted into positive pulses ($V_H$) of the driving pulse signals $\phi V_1$ and $\phi V_3$. As described above, the five binary timing pulse signals $V_1$-$V_4$ are transformed into the two trinary driving pulse signals φV₁ and φV₃ and two binary driving pulse signals φV₂ and φV₄.

FIG. 5 shows an exemplary structure of the conventional driver circuit 120. As shown in FIG. 5, the driver circuit 120 includes clamping circuits 121, first amplitude modulators 122, a second amplitude modulator 124, and pulse adders 123. A negative voltage $(-V_L)$ from the power supply 160 (FIG. 3) is supplied to the clamping circuits 121 and the first amplitude modulators 122. A positive voltage $(V_H)$ is supplied to the second amplitude modulator 124.

The timing pulse signals $V_1$–$V_4$ input to the driver circuit 120 are transformed respectively into signals $V_{1m}$–$V_{4m}$ which have a predetermined amplitude $(-V_L$ to $0)$ by the clamping circuits 121 and the first amplitude modulators 122. The timing pulse signal TG is transformed into a signal $TG_m$ having a predetermined amplitude $(0$ to $V_H)$ by the second amplitude modulator 124 so as to be supplied to the pulse adders 123. FIG. 6 shows the signals $V_{1m}$–$V_{4m}$ and $TG_m$ which are obtained by clamping and modulating the timing pulse signals $V_1$–$V_4$ and TG, respectively.

The signals $V_{2m}$ and $V_{4m}$ which are modulated by the respective first amplitude modulators 122 are directly output as the driving pulse signals φV₂ and φV₄. The signals $V_{1m}$ and $V_{3m}$ which are modulated by the respective first amplitude modulators 122 are supplied to the corresponding pulse adders 123. The pulse adders 123 add the positive level pulses $(V_H)$ which correspond to the aforementioned read-out periods to the signals $V_{1m}$ and $V_{3m}$, respectively, so as to output the resultant signals as the driving pulse signals φV₁ and φV₃.

FIG. 7 shows an exemplary structure of the clamping circuit 121 and the first amplitude modulator 122. The clamping circuit 121 is, as shown in FIG. 7, a diode clamping circuit having a capacitor C and a diode 131. An anode of the diode 131 is supplied with the negative voltage $(-V_L)$ from the power supply 160.

The timing pulse signal, for example, $V_2$ or $V_4$ as represented in FIG. 7, is input via an input line 130a. The clamping circuit 121 couples an AC component of the corresponding timing pulse signal having an amplitude of 5V via the capacitor C. A DC component of the timing pulse signal which is output from the clamping circuit 121 is determined by the fact that a voltage level of a cathode of the diode 131 (i.e., a voltage level of an output line 130b) becomes stable at a voltage level higher than that of the anode thereof (i.e., $-V_L$). Accordingly, as shown in FIG. 7, an output signal on the output line 130b is a binary signal having levels of $-V_L$ and $(-V_L+5V)$.

Strictly speaking, the voltage level of the cathode of the diode 131 that becomes stable is the anode voltage level minus a voltage drop of the diode 131. However, the voltage drop which is about 0.5V will be ignored in order to simplify the explanation in this specification.

The first amplitude modulator 122 includes two stage CMOS inverters 132a and 132b which are coupled between the negative voltage $(-V_L)$ supplied from the power supply 160 and a ground voltage (0V), as shown in FIG. 7. The signal input from the output line 130b to the first amplitude modulator 122 is amplified and inverted by the first CMOS inverter 132a so as to have voltage levels of 0V and $-V_L$ (not shown). The signal is then inverted again by the second CMOS inverter 132b so as to have voltage levels of $-V_L$ and 0V, as shown in FIG. 7. The resultant signal, for example, the signal $V_{2m}$ or $V_{4m}$ as shown in FIG. 7, is output from the first amplitude modulator 122 as the driving pulse signal φV₂ or φV₄ and is used for driving the vertical CCDs 102.

In the case where the resultant signal is either $V_{1m}$ or $V_{3m}$, the signal output from the first amplitude modulator 122 is supplied to the pulse adder 123, as described below.

FIG. 8 shows exemplary structures of the second amplitude modulator 124 and the pulse adder 123. The structures of the clamping circuit 121 and the first amplitude modulator 122 shown in FIG. 8 are the same as those explained above with reference to FIG. 7. The timing pulse signals $V_1$ and $V_3$ are transformed into the amplified signals φV₁ and φV₃, respectively, via the clamping circuit 121 and the first amplitude modulator 122, so as to be input to the pulse adder 123.

The second amplitude modulator 124 includes two stage CMOS inverters 134a and 134b which are coupled between the positive voltage $(V_H)$ supplied from the power supply 160 and a ground voltage (0V), as shown in FIG. 8. The timing pulse signal TG input to the second amplitude modulator 124 is amplified and inverted by the first CMOS inverter 134a so as to have voltage levels of $V_H$ and 0V (signal $TG_m$-bar). The signal is then inverted again by the second CMOS inverter 134b into the signal $TG_m$ having voltage levels of 0V and $V_H$, as shown in FIG. 8. The resultant signal $TG_m$ is supplied to the pulse adders 123.

The pulse adder 123 is a switch-and-add circuit for combining the signals $V_{1m}$ or $V_{3m}$ from the first amplitude modulator 122 and the signal $TG_m$ from the second amplitude modulator 124. As shown in FIG. 8, the pulse adder 123 includes an N-channel MOSFET 133a and a P-channel MOSFET 133b, with respective outputs being coupled to an output line 130c of the pulse adder 123. The signal $V_{1m}$ or $V_{3m}$ from the first amplitude modulator 122 is input to the N-channel MOSFET 133a, and the signal $TG_m$ from the second amplitude modulator 124 is input to the P-channel MOSFET 133b. A gate terminal of the N-channel MOSFET 133a is supplied with the signal $TG_m$-bar which is output from the first CMOS inverter 134a of the second amplitude modulator 124. A gate terminal of the P-channel MOSFET 133b is grounded.

Accordingly, during the transfer period in which the timing pulse signal TG goes low (0V), the signal $TG_m$ is also 0V, which is output from the second amplitude modulator 124 to the output line 130c via the P-channel MOSFET 133b. At the same time, the N-channel MOSFET 133a is turned on by the signal $TG_m$-bar having the high level of $V_H$ which is output from the first CMOS inverter 134a of the second amplitude modulator 124. As a result, in the transfer period, the signals $V_{1m}$ and $V_{3m}$ from the respective first amplitude modulator 122 are output via the corresponding pulse adders 123 as the driving pulse signals φV₁ and φV₃, respectively.

During the read-out period in which the timing pulse signal TG goes high (5V), the N-channel MOSFET 133a is turned off by the signal $TG_m$-bar having the low level (0V) which is output from the first CMOS inverter 134a of the second amplitude modulator 124, while the signal $TG_m$ from the second amplitude modulator 124 goes high $(V_H)$ and is output to the output line 130c via the P-channel MOSFET 133b. As a result, in the read-out period, the signal $TG_m$ from the second amplitude modulator 124 is output via the corresponding pulse adder 123 as the driving pulse signals φV₁ and φV₃, respectively.

As described above, by selectively outputting the outputs from the first and second amplitude modulators 122 and 124 via the respective pulse adders 123 based on the timing pulse signal TG, the signals $V_{1m}$ and $V_{3m}$ are combined with the signal $TG_m$, respectively, so as to generate the driving signals φV₁ and φV₃ for reading out the photoelectric charges from the photo-diodes 101 and for transferring the electric charges through the vertical CCDs 102.

As described above, the conventional driver circuit 120 requires both a positive supply voltage ($V_H$) for reading out the photoelectric charges and a negative supply voltage ($-V_L$) for transferring such charges. Thus, the power supply 160 should supply two voltage levels of different polarization (i.e., positive and negative). Consequently, the power supply 160 has relatively complicated circuitry and occupies a relatively large area of the camera device. This makes it difficult to miniaturize camera systems utilizing CCD type camera devices and to reduce costs thereof. Such problem associated with the requirement that a power supply provide two voltage levels of different polarization is not limited only to a specific issue of driver circuits for CCD type camera devices, but is also a common problem of conventional driver circuits for generating multi-level signals in order to drive various systems.

SUMMARY OF THE INVENTION

The driver circuit of this invention is a circuit for generating a driving pulse signal having a plurality of levels based on an input timing signal using a supply voltage of a first polarization. The driver circuit includes a circuit for generating a first voltage from the supply voltage; a first amplitude modulator for amplifying the input timing signal using the first voltage, thereby generating a modulated signal having an amplitude of the first voltage; and a clamping circuit for clamping a DC component of the modulated signal so as to be held at a predetermined clamping voltage level, and for substantially maintaining an AC component of the modulated signal, thereby generating a pulse signal having an amplitude substantially the same as that of the AC component of the modulated signal and having a second voltage level of a second polarization opposite to the first polarization.

The generating circuit may be a voltage divider for generating the first voltage by dividing the supply voltage, and the clamping circuit may use a clamping voltage between the grounded voltage level and the first voltage level as the predetermined clamping voltage.

Preferably, the driver circuit includes an adder circuit for combining a third signal having at least one predetermined voltage level with the pulse signal output from the clamping circuit so as to generate a driving pulse signal having at least three different levels.

The third signal may be a DC voltage signal having the source supply voltage of the first polarization.

Alternatively, the third signal may be a pulse signal having levels of the source supply voltage and the grounded voltage.

The adder circuit may include a switch circuit for selectively outputting the pulse signal generated by the clamping circuit and the third signal based on a predetermined timing.

The driver circuit may includes a second amplitude modulator for amplifying a second input timing signal using the source supply voltage of the first polarization, thereby generating a second modulated signal having levels of the source supply voltage and a grounded voltage.

The third signal may be the second modulated signal.

The clamping voltage may be the grounded voltage.

The clamping circuit may be a diode clamping circuit including a capacitor and a diode.

The method of this invention is a method for generating a driving pulse signal having a plurality of levels based on an input timing signal using a supply voltage of a first polarization. The method includes the steps of: generating a first voltage from the supply voltage; amplifying the input timing signal using the first voltage, thereby generating a modulated signal having an amplitude of the first voltage; and clamping the modulated signal so that a DC component of the modulated signal is held at a predetermined clamping voltage level, and substantially maintaining an AC component of the modulated signal, thereby generating a pulse signal having an amplitude substantially the same as that of the AC component of the modulated signal and having a second voltage level of a second polarization opposite to the first polarization.

In the generating step, the first voltage may be generated by dividing the supply voltage, and in the clamping step, the predetermined clamping voltage may be between the grounded voltage level and the first voltage level.

The method may includes a step of combining a third signal having at least one predetermined voltage level with the pulse signal generated in the clamping step, thereby generating a driving pulse signal having at least three different levels.

The third signal used in the combining step may be a DC voltage signal having the source supply voltage level of the first polarization.

Alternatively, the third signal used in the combining step may be a pulse signal having levels of the source supply voltage and the grounded voltage.

The combining step may include the step of selectively outputting the pulse signal generated in the clamping step and the third signal based on a predetermined timing.

The method may further includes a step of amplifying a second input timing signal using the source supply voltage of the first polarization, thereby generating a second modulated signal having levels of the source supply voltage and a grounded voltage.

The third signal used in the combining step may be the second modulated signal.

The clamping voltage used in the clamping step may be the grounded voltage.

Thus, the invention described herein makes possible the advantages of (1) providing a driver circuit for generating a driving pulse signal having pulse peaks at a level having a polarization different from that of input pulse signals using a power supply having a voltage level of a single polarization, and (2) providing a driver circuit which requires a single supply voltage level of either polarization for generating a driving pulse signal having multi-level peaks including peaks at the other polarization.

These and other advantages of the present invention will become apparent to those skilled in the art upon reading and understanding the following detailed description with reference to the accompanying figures.

DESCRIPTION OF THE PREFERRED EMBODIMENTS

Hereinafter, a driver circuit of the present invention will be described by way of illustrative examples with reference to the accompanying drawings. The driver circuit of the present invention will be explained in the context of a driver circuit for driving a CCD type camera device.

Figure 1:
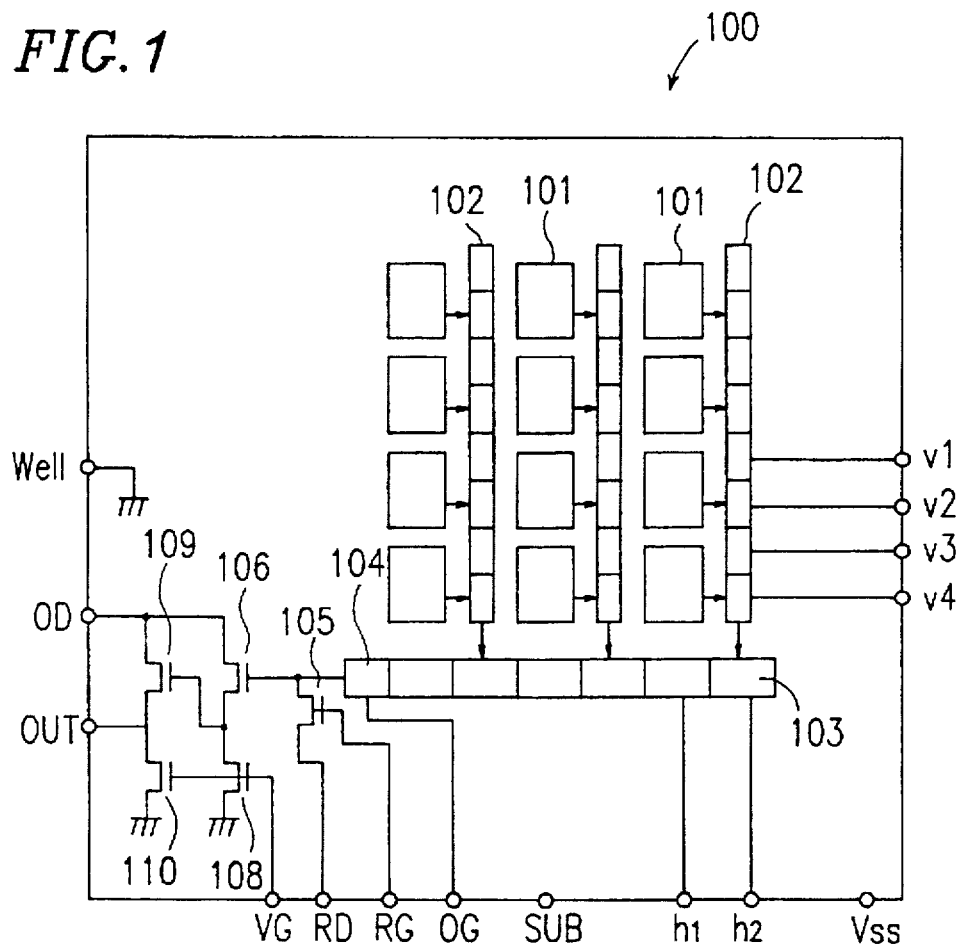
FIG. 1 is a schematic diagram showing a structure of a conventional CCD type camera device.
Figure 2:
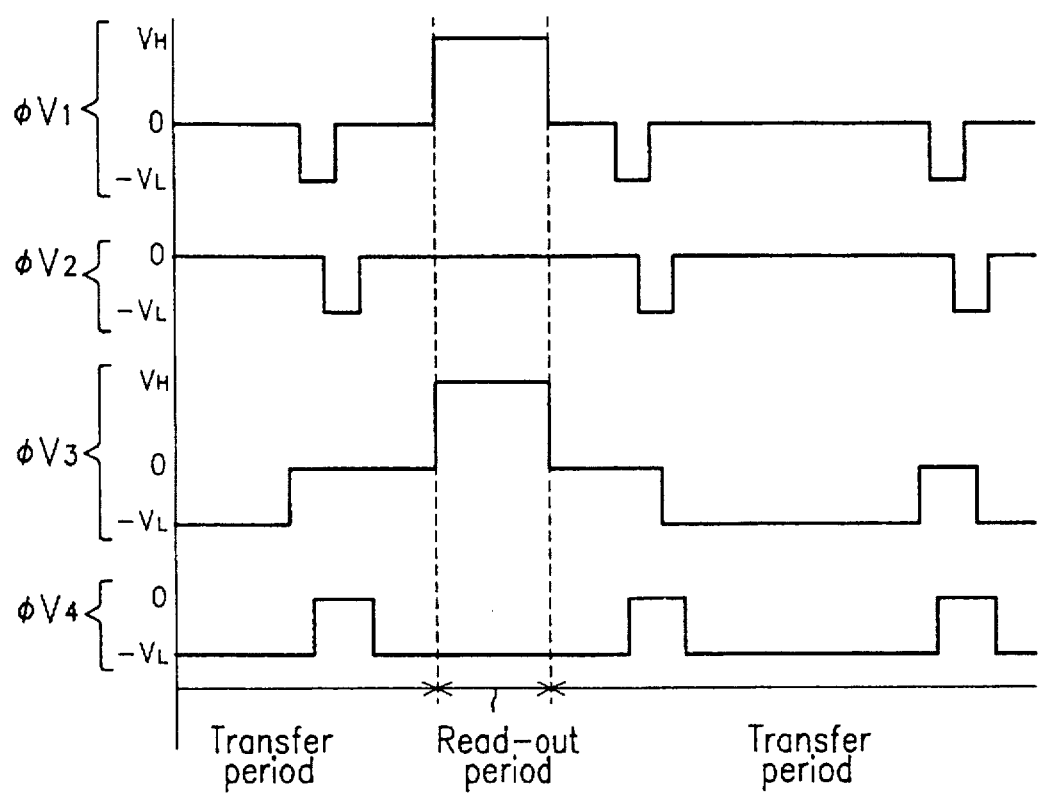
FIG. 2 is a timing diagram illustrating pulse signals for driving vertical CCDs in the conventional CCD type camera device.
Figure 3:
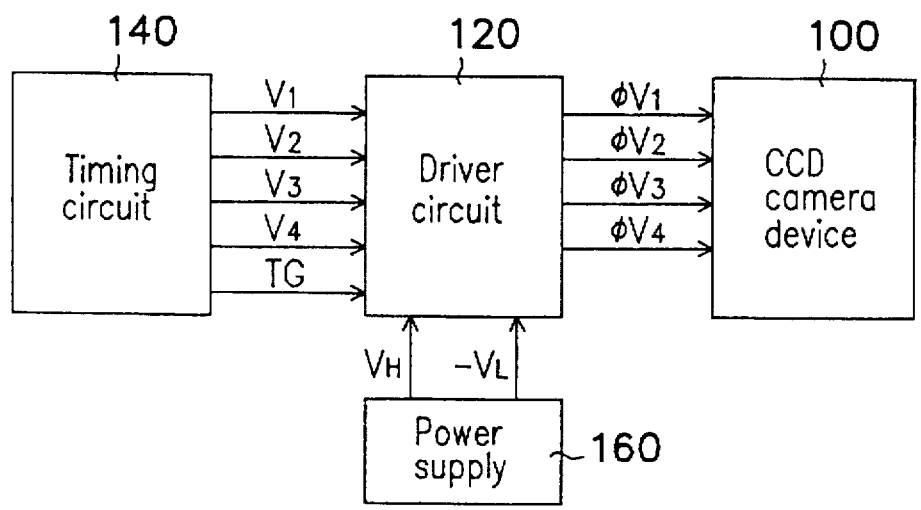
FIG. 3 is a block diagram showing a conventional driver circuit, timing circuit, and power supply for driving the CCD type camera device.
Figure 4:
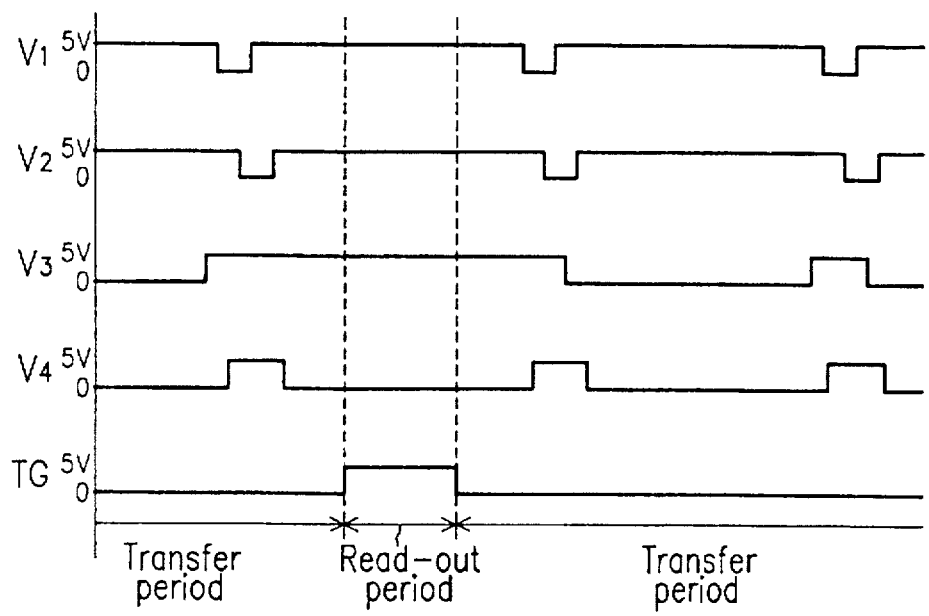
FIG. 4 is a timing diagram illustrating timing pulse signals generated by the conventional timing circuit.
Figure 5:
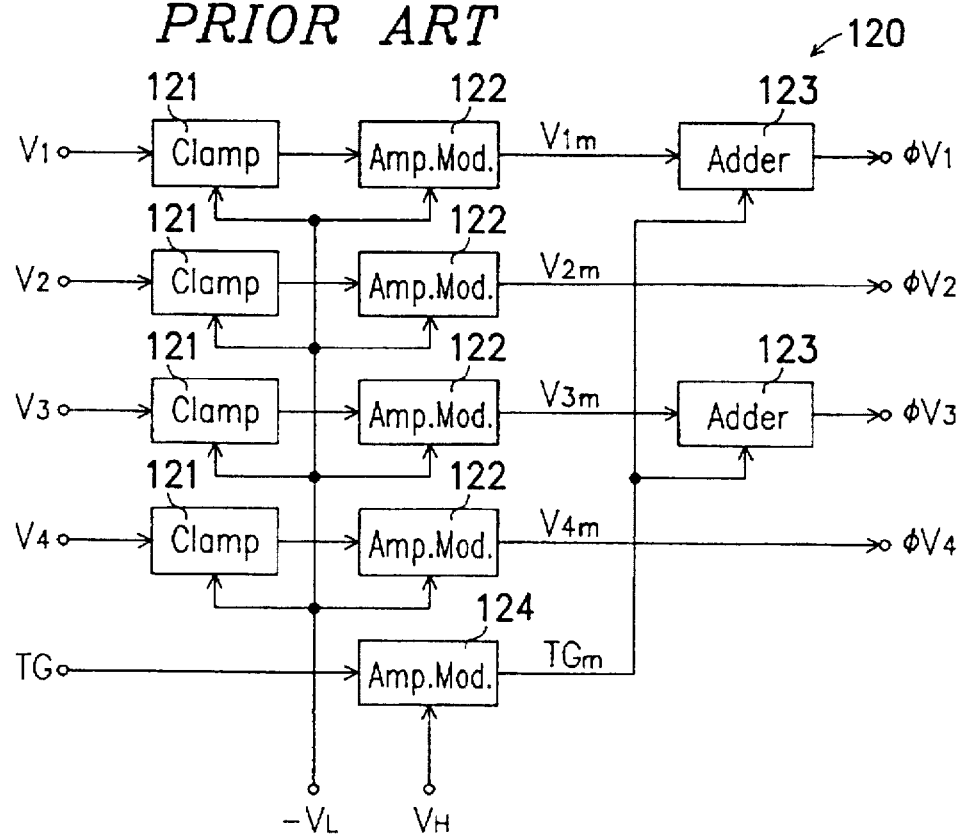
FIG. 5 is a block diagram showing a structure of the conventional driver circuit.
Figure 6:
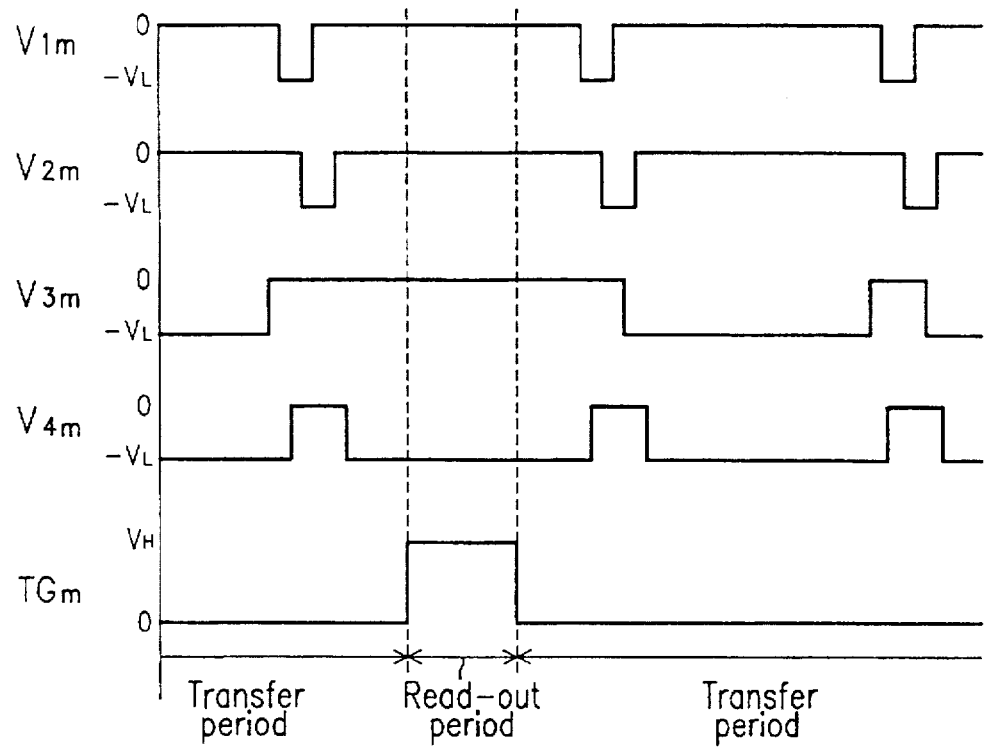
FIG. 6 is a timing diagram illustrating pulse signals output from conventional amplitude modulators in the conventional driver circuit.
Figure 7:
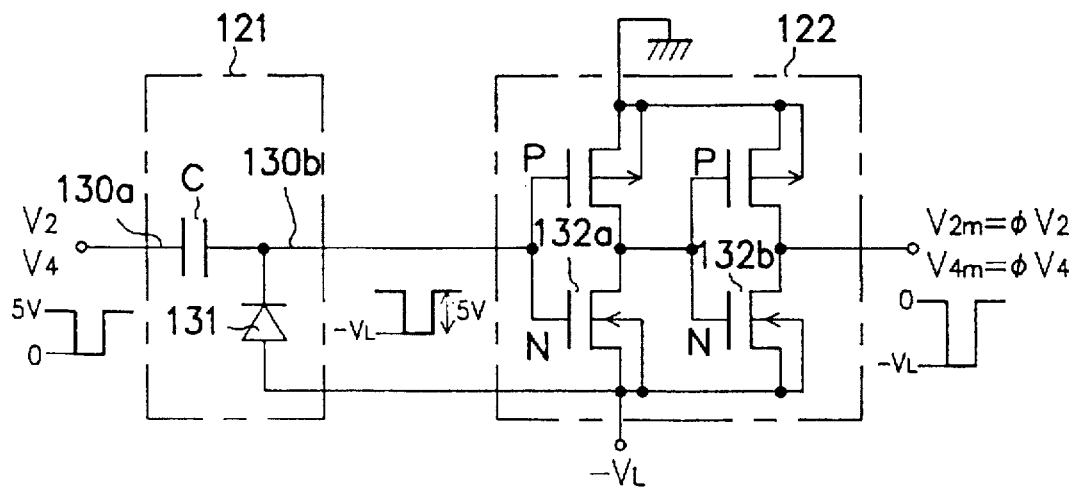
FIG. 7 is a schematic diagram illustrating respective structures of a clamping circuit and the amplitude modulator in the conventional driver circuit.
Figure 8:
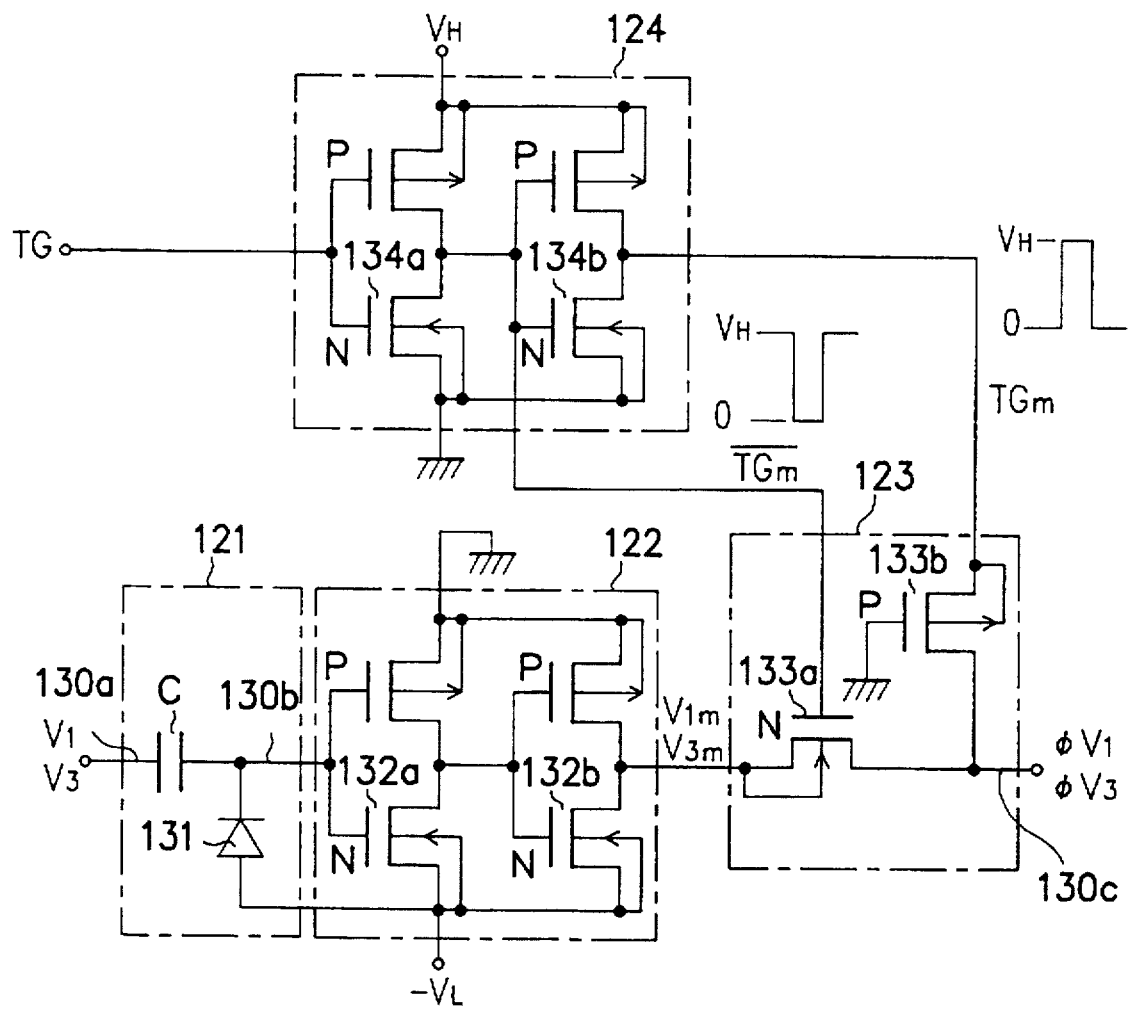
FIG. 8 is a schematic diagram illustrating respective structures of the clamping circuit, the amplitude modulator, and a pulse adder in the conventional driver circuit.
Figure 9:
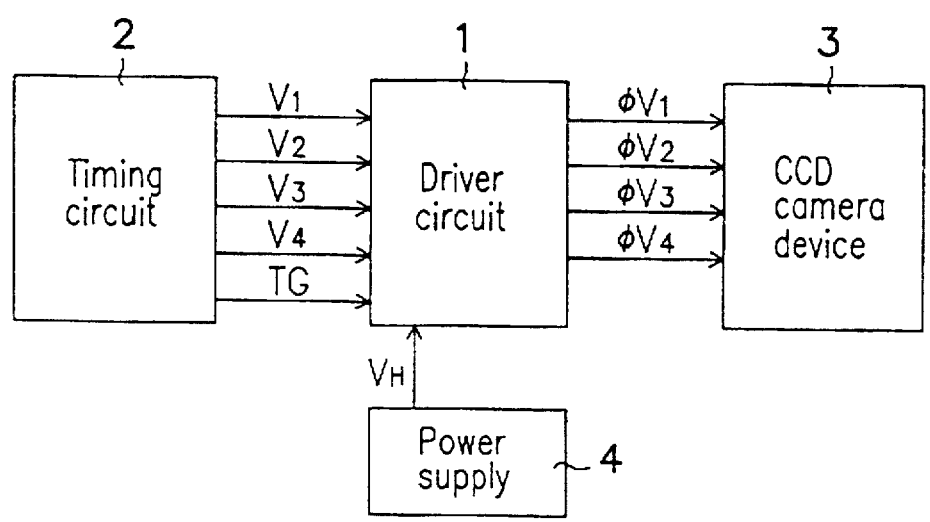
FIG. 9 is a block diagram showing a system for driving a CCD type camera device according to the present invention.

FIG. 9 illustrates a system in which a driver circuit 1 of the present invention is used for driving a CCD type camera device 3. As shown in FIG. 9, the driver circuit 1 is supplied with a DC voltage at a positive level $(V_H)$ from a power supply 4, and is supplied with timing pulse signals $V_1$–$V_4$ and TG from a timing circuit 2 included in a peripheral integrated circuit (IC). The timing circuit 2 generates the timing pulse signals $V_1$–$V_4$ and TG in the same manner as that of the conventional timing circuit 140 described above in relation to FIG. 3. The timing pulse signals $V_1$–$V_4$ carry pulses for transferring electric charges through vertical CCDs (not shown) in the CCD camera device 3, and the timing pulse signal TG carries pulses for reading photoelectric charges from diodes (not shown) to the vertical CCDs, in the same manner as described above with respect to the conventional CCD type camera device 100.

The driver circuit 1 of the present invention generates driving pulse signals $\phi V_1$–$\phi V_4$ having peaks at predetermined voltage levels, based on the timing pulse signals $V_1$–$V_4$ and TG which have peaks at logic voltage levels, for example, at 0V and 5V, using a single positive supply voltage $(V_H)$. The driving pulse signals $\phi V_1$–$\phi V_4$ are applied to the CCD type camera device 3.

EXAMPLE 1

Figure 10:
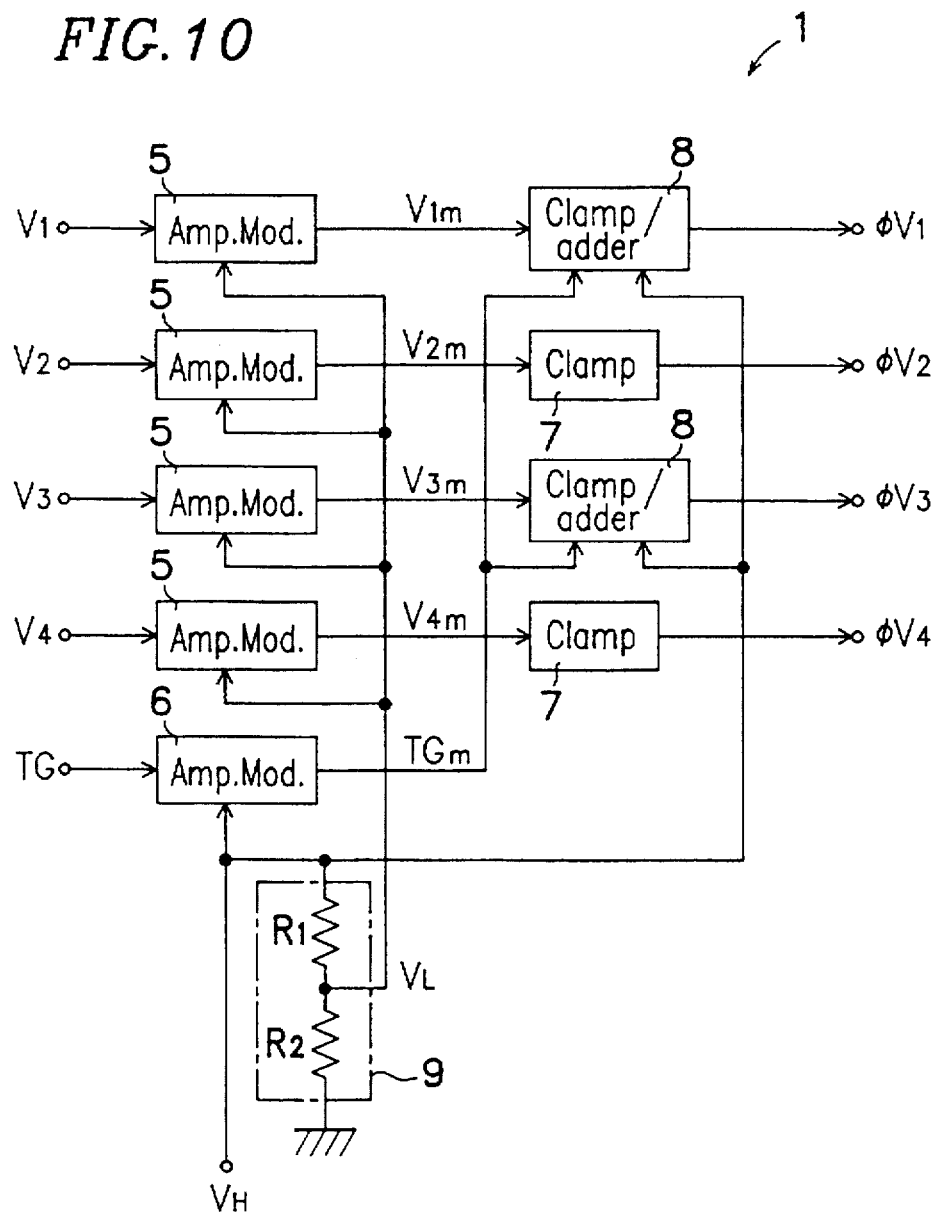
FIG. 10 is a block diagram showing a structure of the driver circuit according to one embodiment of the present invention.

FIG. 10 shows an exemplary structure of the driver circuit 1 according to one embodiment of the present invention. As shown in FIG. 10, the driver circuit 1 includes first amplitude modulators 5, each provided for receiving one of the timing pulse signals $V_1$–$V_4$, a second amplitude modulator 6 for receiving the timing pulse signal TG, clamping circuits 7, clamp/adder circuits 8, and a voltage divider 9. A positive voltage $(V_H)$ from the power supply 4 is supplied to the second amplitude modulator 6, one terminal of the voltage divider 9, and the clamp/adder circuits 8. An output (intermediate voltage $V_L$) of the voltage divider 9 is supplied to the first amplitude modulators 5.

The timing pulse signals $V_1$–$V_4$ from the timing circuit 2 are input to the corresponding first amplitude modulators 5, respectively. The first amplitude modulators 5 transform the timing pulse signals $V_1$–$V_4$ into modulated signals $V_{1m}$–$V_{4m}$ which have a predetermined amplitude having peaks at 0V and $V_L$, respectively, using the intermediate voltage $V_L$ supplied from the voltage divider 9. The modulated signals $V_{1m}$ and $V_{3m}$ are input to the corresponding clamp/adder circuits 8, and the modulated signals $V_{2m}$ and $V_{4m}$ are input to the corresponding clamping circuits 7.

The timing pulse signal TG is input to the second amplitude modulator 6. The second amplitude modulator 6 transforms the timing pulse signal TG into a signal $TG_m$ which has a predetermined amplitude having peaks at 0V and $V_H$, using the positive voltage $V_H$ supplied from the power supply 4. The signal $TG_m$ is referred to as a first modulated signal. As will be described more in detail below, the first modulated signal $TG_m$ is generated by amplifying and inverting the timing pulse signal TG, i.e., the first modulated signal $TG_m$ goes high when the timing pulse signal goes low and vice versa. The first modulated signal $TG_m$ is input to the clamp/adder circuit 8.

The outputs from the clamping circuits 7 are the driving signals $\phi V_2$ and $\phi V_4$ which are used for transferring electric charges in the vertical CCDs. The outputs from the clamp/adder circuits 8 are the driving signals $\phi V_1$ and $\phi V_3$ used for transferring electric charges in the vertical CCDs and reading photoelectric charges from the diodes to the vertical CCDs.

As shown in FIG. 10, the voltage divider 9 includes resistors $R_1$ and $R_2$ connected in a series, one terminal being coupled to the positive voltage $V_H$, the other grounded at 0V. The intermediate voltage $V_L$, which is obtained by division of the positive voltage $V_H$, is output from a connecting node of the resistors $R_1$ and $R_2$ so as to input the first amplitude modulators 5.

Figure 11:
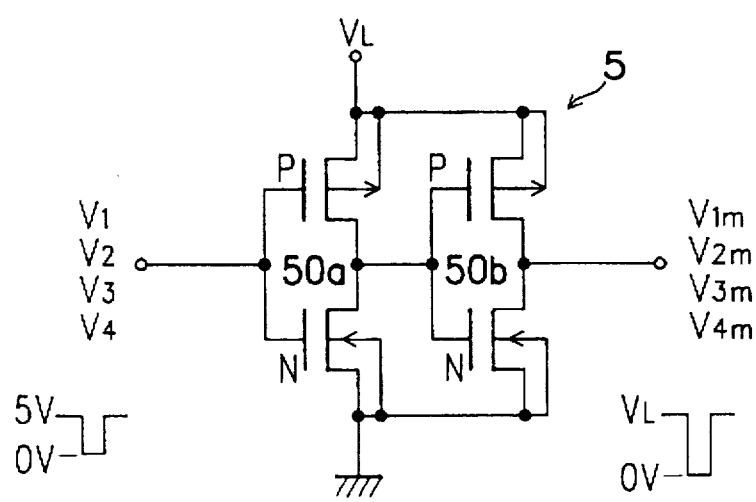
FIG. 11 is a schematic diagram showing a structure of a first amplitude modulator of the driver circuit according to the present invention.

FIG. 11 shows an exemplary structure of the first amplitude modulator 5. The first amplitude modulator 5 includes two stage CMOS inverters 50a and 50b which are coupled between the intermediate voltage $(V_L)$ supplied from the voltage divider 9 and a ground voltage (0V). As shown in FIG. 11, each CMOS inverter consists of an N-channel MOSFET (N) and a P-channel MOSFET (P).

Figure 12:
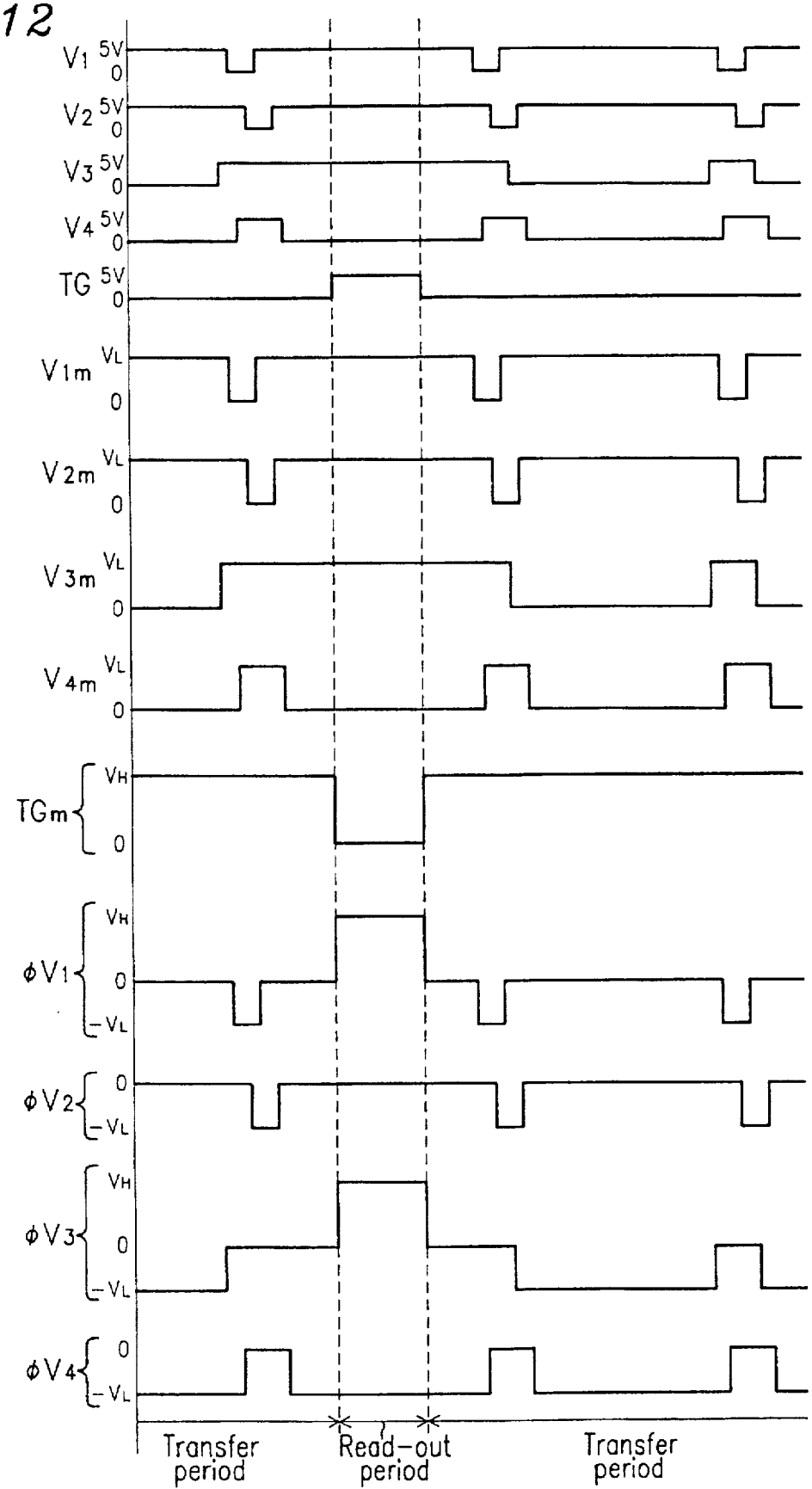
FIG. 12 is a timing diagram illustrating pulse signals which are used and generated in the driver circuit according to the present invention.

Each of the timing pulse signals $V_1-V_4$ which is input to the corresponding first amplitude modulator 5 is amplified and inverted by the first CMOS inverter 50a so as to have peaks at voltage levels of 0V and $V_L$. The signal is then inverted again by the second CMOS inverter 50b so as to have the same phase as that of the corresponding input timing signal, and is output as the corresponding one of the modulated signals $V_{1m}-V_{4m}$. The input timing pulse signals $V_1-V_4$ and the corresponding output modulated signals $V_{1m}-V_{4m}$ are shown in FIG. 12.

Figure 13:
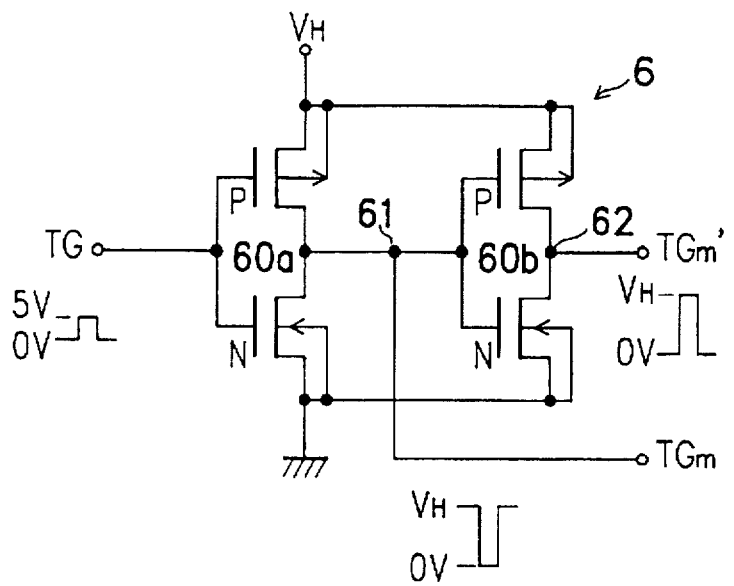
FIG. 13 is a schematic diagram showing a structure of a second amplitude modulator of the driver circuit according to the present invention.

FIG. 13 shows an exemplary structure of the second amplitude modulator 6. The second amplitude modulator 6 includes two stage CMOS inverters 60a and 60b which are coupled between the positive voltage $(V_H)$ supplied from the power supply 4 and a ground voltage (0V). As shown in FIG. 13, each CMOS inverter consists of an N-channel MOSFET (N) and a P-channel MOSFET (P).

The timing pulse signal TG which is input to the second amplitude modulator 6 is amplified and inverted by the first CMOS inverter 60a into the first modulated signal $TG_m$ having peaks at voltage levels of 0V and $V_H$. The first modulated signal $TG_m$ is output from a node 61 between the first and second CMOS inverters 60a and 60b. At the same time, the first modulated signal $TG_m$ is input to the second CMOS inverter 60b and inverted again so as to have the same phase as that of the input timing pulse signal TG, and is output as a second modulated signal $TG_m'$ having peaks at voltage levels of 0V and $V_H$, as shown in FIG. 13. The input timing pulse signal TG and the first modulated signal $TG_m$ are shown in FIG. 12.

In this embodiment, as shown in FIG. 10, the first modulated signal $TG_m$ is input to the clamp/adder circuits 8; however, the second modulated signal $TG_m'$ is not used. In the case where the second modulated signal $TG_m'$ is also input to the clamp/adder circuits 8 will be discussed in Example 2 below.

Figure 14:
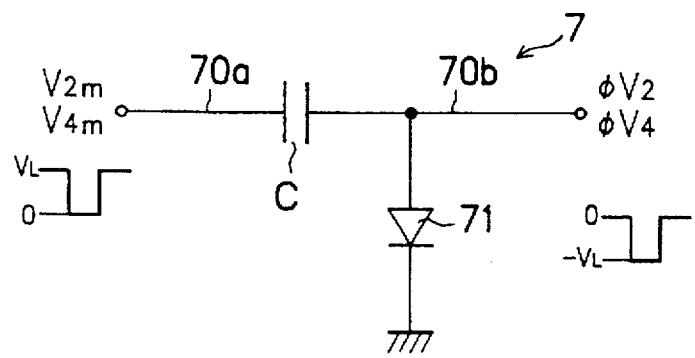
FIG. 14 is a schematic diagram showing an exemplary structure of a clamping circuit of the driver circuit according to the present invention.

FIG. 14 shows an exemplary structure of the clamping circuit 7. As shown in FIG. 14, the clamping circuit 7 includes a capacitor C provided between an input line 70a and an output line 70b, and a diode 71 connected to the output line 70b. An anode of the diode 71 is connected to the output line 70b and a cathode thereof is grounded at 0V. The clamping circuit 7 is a negative diode clamping circuit in which a forward directed voltage is from the output line 70b to the ground.

The clamping circuit 7 couples an AC component of the corresponding timing pulse signal $(V_{2m}$ or $V_{4m})$ which is input to the input line 70a having an amplitude of $V_L$ via the capacitor C. A DC component of the timing pulse signal which is output from the clamping circuit 7 is determined by the fact that a voltage level of the output line 70b becomes stable when a voltage level of the cathode of the diode 71 (i.e., 0V) is higher than that of the anode thereof. That is, the voltage level of the output line 70b which is connected to the anode of the diode 71 is shifted below 0V. Accordingly, as shown in FIG. 14, the signal on the output line 70b is a binary signal having peak levels at $-V_L$ and 0V, and is output as driving signal $\phi V_2$ or $\phi V_4$. The modulated signals $V_{2m}$ and $V_{4m}$ and the driving signals $\phi V_2$ and $\phi V_4$ are shown in FIG. 12.

As described above, by clamping using the ground voltage (0V), the driving signals $\phi V_2$ and $\phi V_4$ having peaks at a negative level $(-V_L)$ and a ground level (0V) are generated from the modulated signals $V_{2m}$ and $V_{4m}$ having peaks at a ground level (0V) and a positive level $(V_L)$, with the amplitude thereof remaining the same. A voltage drop of the diode 71 is disregarded for the sake of simplicity.

A capacitance of the capacitor C of the clamping circuit 7 is preferably large so as not to decrease the amplitude of the pulse signals. For example, a preferable value of the capacitance of the capacitor C for ⅓ inch type CCDs is about 0.1 μF or more. In this case, since load capacitance of electrodes of the vertical CCDs is about 3000 pF, a voltage level applied to the electrodes is decreased by capacitive division with the capacitor C of 0.1 μF, as shown in the following Eq. (1).

$$\frac{0.1\ \mu F}{0.1\ \mu F + 3000\ pF} = 97.1\% \qquad (1)$$

Such a decrease as 97.1% does not cause problems in practical use of the vertical CCDs.

The clamping circuits 7 can be implemented using other semiconductor devices other than a diode clamping circuit 7. For example, a MOSFET can be used as a two terminal switching device by connecting a gate terminal and a drain terminal thereof. Such device is turned on by an electric current flowing through source and drain electrodes thereof larger than a threshold value.

Figure 15:
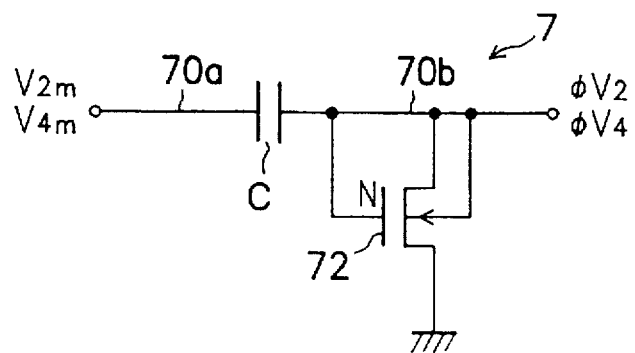
FIG. 15 is a schematic diagram showing another exemplary structure of the clamping circuit of the driver circuit according to the present invention.
Figure 16:
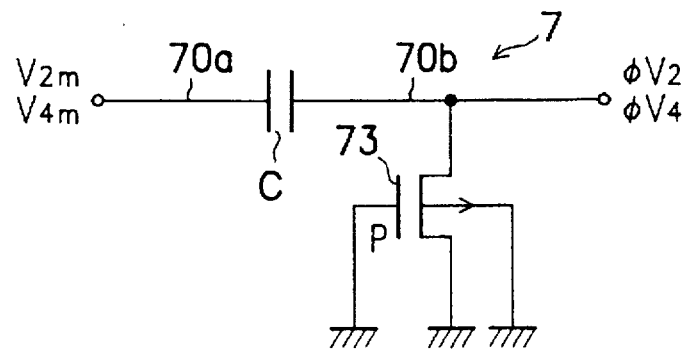
FIG. 16 is a schematic diagram showing still another exemplary structure of the clamping circuit of the driver circuit according to the present invention.

FIG. 15 shows an exemplary structure of the clamping circuit 7 utilizing an N-channel MOSFET 72 instead of the diode 71. Gate and drain terminals of the MOSFET 72 are connected to the output line 70b and a source terminal is grounded. FIG. 16 shows another exemplary structure of the clamping circuit 7 utilizing a P-channel MOSFET 73 instead of the diode 71. Gate and drain terminals of the MOSFET 73 are grounded and a source terminal is connected to the output line 70b.

The structure of the clamping circuit 7 is not limited to these examples. The clamping circuit 7 can be implemented as a peak clamping circuit or other kind of clamping circuit.

Figure 17:
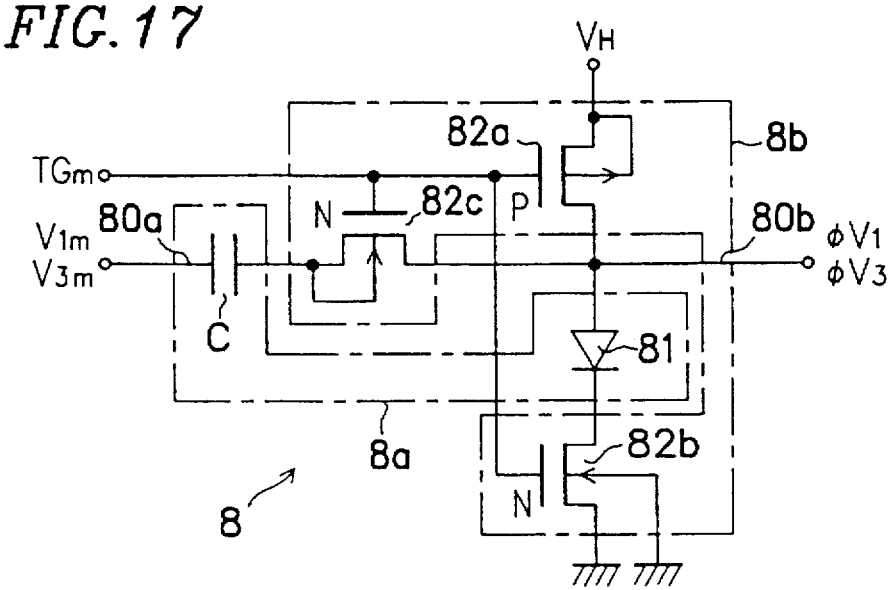
FIG. 17 is a schematic diagram showing an exemplary structure of a clamp/adder circuit of the driver circuit according to the present invention.

FIG. 17 shows an exemplary structure of the clamp/adder circuit 8. As shown in FIG. 17, the clamp/adder circuit 8 includes a clamp portion 8a and a pulse adder portion 8b. The clamp portion 8a has a structure similar to that of the clamping circuit 7, including a capacitor C provided between an input line 80a and an output line 80b, and a diode 81 connected to the output line 80b. An N-channel MOSFET 82c of the pulse adder portion 8b is inserted between the capacitor C and the diode 81. A capacitance of the capacitor C in the clamp portion 8a is about 0.1 µF or more, as in the case of the clamping circuit 7.

The pulse adder portion 8b includes a P-channel MOSFET 82a and two N-channel MOSFETs 82b and 82c. Depending on whether the P-channel MOSFET 82a is on or off, the P-channel MOSFET 82a controls the electric connection between the positive supply voltage ($V_H$) and the output line 80b. The N-channel MOSFET 82b controls an electric connection between a cathode of the diode 81 of the clamp portion 8a and the ground voltage (0V). The N-channel MOSFET 82c controls an electric connection between the capacitor C of the clamp portion 8a and the output line 80b. Respective gate terminals of the MOSFETs 82a–82c are supplied with the first modulated signal $TG_m$ which is output from the node 61 of the second amplitude modulator 6 (shown in FIG. 13).

As shown in FIG. 12, the first modulated signal $TG_m$ goes high ($V_H$) as the timing pulse signal TG goes low (0V) during the transfer period. Thus, during the transfer period, the P-channel MOSFET 82a is turned off and the N-channel MOSFETs 82b and 82c are turned on, so that the structure of the clamp portion 8a becomes the same as that of the clamping circuit 7. That is, in the transfer period, the output of the capacitor C is coupled to the output line 80b to which an anode of the diode 81 is connected, with a cathode of the diode 81 being grounded. Consequently, the clamp portion 8a operates in the same manner as the clamping circuit 7.

In the transfer period, the clamp portion 8a couples an AC component of the corresponding modulated signal ($V_{1m}$ or $V_{3m}$) which is input to the input line 80a having an amplitude of $V_L$ via the capacitor C. A DC component of the modulated signal is clamped by the diode 81 in the same manner as by the diode 71 in the clamping circuit 7. Accordingly, the signal on the output line 80b has peaks at levels of $-V_L$ and 0V, and is output as driving signal $\phi V_1$ or $\phi V_3$.

In the read-out period, as shown in FIG. 12, the first modulated signal $TG_m$ goes low ($V_L$) as the input timing pulse signal TG goes high (5V). Thus, during the read-out period, the P-channel MOSFET 82a is turned on and the N-channel MOSFETs 82b and 82c are turned off, so that the positive supply voltage $V_H$ is output to the output line 80b via the P-channel MOSFET 82a. Accordingly, the signal having a peak at $V_H$ is output from the output line 80b as the driving signal $\phi V_1$ or $\phi V_3$.

Consequently, the driving signals $\phi V_1$ and $\phi V_3$ output from the respective clamp/adder circuits 8 are trinary pulse signals having a negative level ($-V_L$) and a positive level ($V_H$), and an intermediate level (0V), as shown in FIG. 12.

Figure 18:
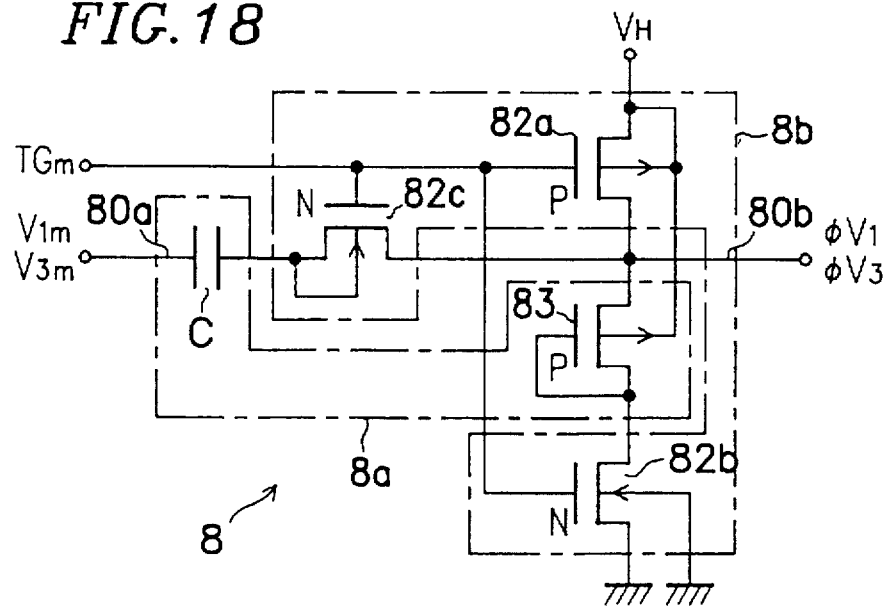
FIG. 18 is a schematic diagram showing another exemplary structure of the clamp/adder circuit of the driver circuit according to the present invention.

The clamp portion 8a of the clamp/adder circuit 8 can be implemented using other semiconductor devices, such as MOSFETs, rather than the diode 81 in a similar manner as in the clamping circuit 7. For example, as shown in FIG. 18, the clamp portion 8a can utilize a P-channel MOSFET 83 instead of the diode 81. Gate and drain terminals of the P-channel MOSFET 83 are grounded via the N-channel MOSFET 82b, and a source terminal is connected to the output line 80b.

Figure 19:
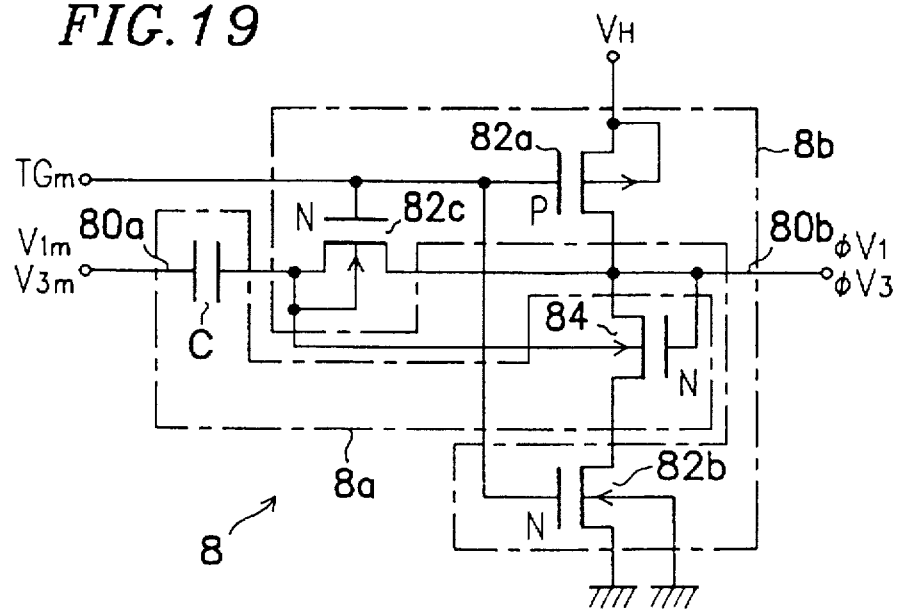
FIGS. 19–22 are schematic diagrams showing other exemplary structures of the clamp/adder circuit of the driver circuit according to the present invention.

FIG. 19 shows another exemplary structure of the clamp portion 8a of the clamp/adder circuit 8, in which an N-channel MOSFET 84 is utilized instead of the diode 81. Gate and drain terminals of the N-channel MOSFET 84 are connected to the output line 80b and a source terminal thereof is grounded via the N-channel MOSFET 82b. The structure of the clamp portion 8a is not limited to these examples. The clamp portion 8a can be implemented using a peak clamping circuit or other kind of clamping circuit as will be appreciated.

Next, exemplary designs of elements in the clamp/adder circuit 8 will be described. It is sufficient for the capacitor C of the clamp portions 8a to have a capacitance of about 0.1 µF or more, as described above. The capacitance of the capacitor C is relatively large. Nevertheless, in the case where the driver circuit 1 is implemented as an integrated circuit (IC) or is integrated with the CCD type camera device 3 as described later in Example 3, the capacitor C can be integrated with other elements such as MOSFETs in one substrate utilizing dielectric materials and/or thin film techniques for insulating layers. Alternatively, the capacitor C having a relatively large capacitance may be included in peripheral circuits.

Transistors used for the MOSFETs 82a–82c in the pulse adder portion 8b are designed to have a relatively large conductance for quickly driving a load capacitance of the order of $10^3$ pF so as to transfer electric charges in the vertical CCDs. Mutual conductance $g_m$ of a transistor in a saturated region is expressed by the following Eq. (2).

$$g_m = \frac{W}{L} \mu C_0 (V_{GS} - V_{th}) \tag{2}$$

where W denotes gate width, L denotes gate length, µ denotes channel mobility, $C_0$ denotes gate capacitance per unit area, $V_{GS}$ denotes voltage between gate and source, and $V_{th}$ denotes threshold voltage of the transistor.

Accordingly, the mutual conductance $g_m$ can be increased by making a design size (i.e., W/L) of the transistor large. For example, in the case of CCD type camera devices for video cameras in which vertical CCDs are driven under a TV standard, a time constant τ of rising and falling pulses is required to be about 100 ns. The time constant τ is expressed as the following Eq. (3).

$$\tau = \frac{C_L}{g_m} \tag{3}$$

In ⅓ inch type CCD camera devices, since a load capacitance $C_L$ of electrodes in vertical CCDs is about 3000 pF, the mutual conductance $g_m$ is about 30 mΩ. For example, suppose a gate capacitance $C_0$ is calculated from the following conditions: a voltage difference between the gate-source voltage $V_{GS}$ and the threshold voltage $V_{th}$ (i.e., $V_{GS}-V_{th}$) is 5V; a thickness of a gate insulation film is 800 Å; the mobility $\mu_N$ of an N-channel MOSFET is 600 cm²/VS; and the mobility $\mu_N$ of a P-channel MOSFET is 200 cm²/VS. Then, respective design sizes (W/L) of P-channel and N-channel MOSFETs obtained using Eq.(2) are about 700 for P-channel MOSFET 82a and about 230 for N-channel MOSFETs 82b and 82c.

Figure 20:
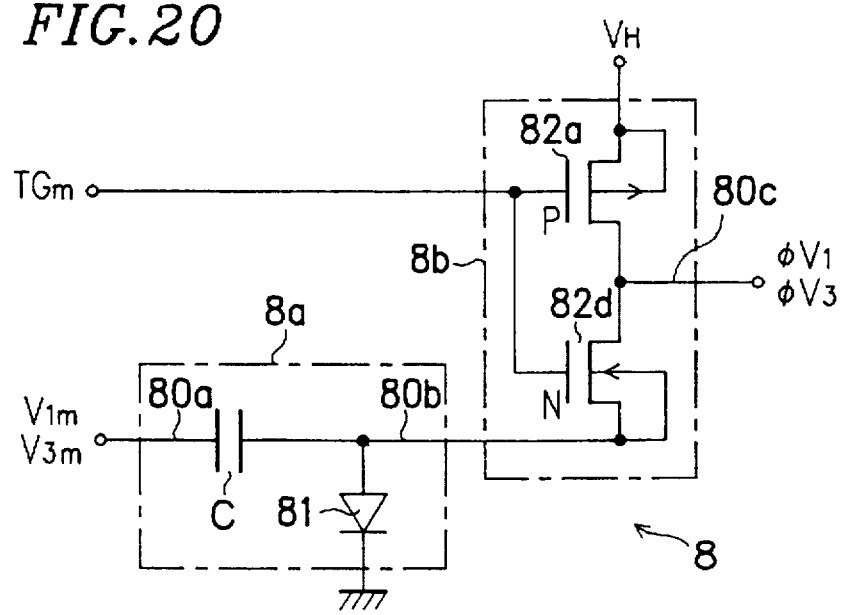

Next, another example of the clamp/adder circuit 8 will be described. FIG. 20 shows an exemplary structure of the clamp/adder circuit 8 in which the pulse adder portion 8b is implemented utilizing a P-channel MOSFET 82a and an N-channel MOSFET 82d.

As shown in FIG. 20, the clamp portion 8a of the clamp/adder circuit 8 is similar to the clamping circuit 7 as shown in FIG. 14. The clamp portion 8a of FIG. 20 is a negative diode clamping circuit including a capacitor C and a diode 81. An output line 80b of the clamp portion 8a is connected to a source terminal of the N-channel MOSFET 82d of the pulse adder portion 8b. A capacitance of the capacitor C of the clamp portion 8a is about 0.1 µF or more, as in the case of the clamping circuit 7.

In the pulse adder portion 8b, a source terminal of the P-channel MOSFET 82a is supplied with the positive supply voltage $V_H$. Respective drain terminals of the P-channel MOSFET 82a and N-channel MOSFET 82d are coupled to the output line 80c. Respective gate terminals of the P-channel MOSFET 82a and N-channel MOSFET 82d are supplied with the first modulated signal $TG_m$ which is output from the node 61 of the second amplitude modulator 6 (shown in FIG. 13).

Accordingly, during the transfer period in which the first modulated signal $TG_m$ goes high ($V_H$), the P-channel MOSFET 82a is turned off and the N-channel MOSFET 82d is turned on, so that the signal on the output line 80b is output via the output line 80c. As described above, the clamp portion 8a operates so as to couple an AC component of the corresponding modulated signal ($V_{1m}$ or $V_{3m}$) which is input to the input line 80a having an amplitude of $V_L$ via the capacitor C, and to clamp a DC component of the modulated signal by the diode 81, in the same manner as the clamping circuit 7. As a result, the signal on the output line 80b from the clamp portion 8a has peaks at levels of $-V_L$ and 0V during the transfer period, and is output as a driving signal $\phi V_1$ or $\phi V_3$ via the output line 80c.

In the read-out period in which the first modulated signal $TG_m$ goes low (0V), the P-channel MOSFET 82a is turned on and the N-channel MOSFET 82d is turned off, so that the positive supply voltage $V_H$ is output to the output line 80c. Accordingly, the signal on the output line 80c having a peak level at $V_H$ is output as the driving signal $\phi V_1$ or $\phi V_3$ from the clamp/adder circuit 8 during the read-out period.

Consequently, the driving signals $\phi V_1$ and $\phi V_3$ output from the clamp/adder circuit 8 are trinary pulse signals having a negative level ($-V_L$) and a positive level ($V_H$), and an intermediate level (0V), as shown in FIG. 12.

Figure 21:
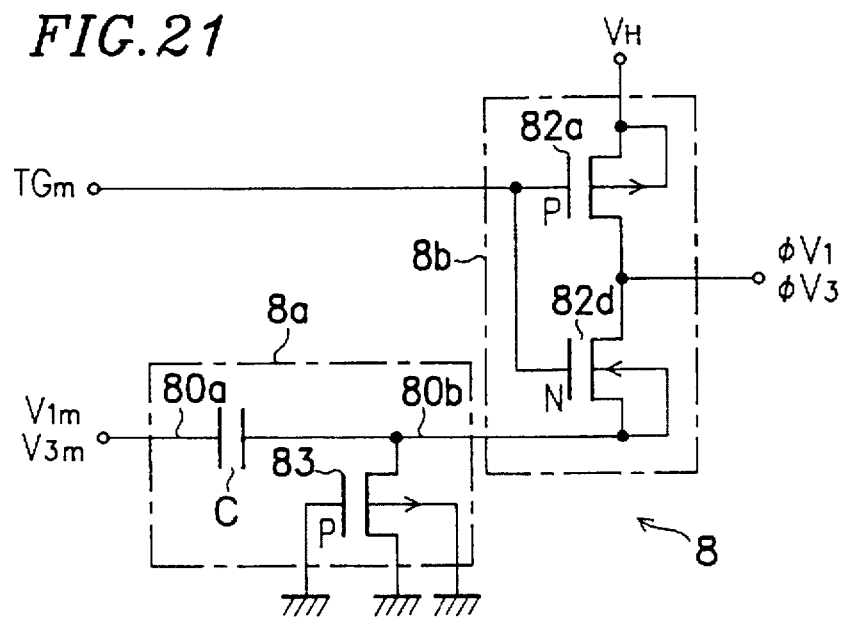

The clamp portion 8a of the clamp/adder circuit 8 of FIG. 20 can be implemented using other semiconductor devices, such as MOSFETs, in place of the diode 81. For example, as shown in FIG. 21, the clamp portion 8a can utilize a P-channel MOSFET 83 instead of the diode 81. Gate and drain terminals of the P-channel MOSFET 83 are grounded, and a source terminal thereof is connected to the output line 80b.

Figure 22:
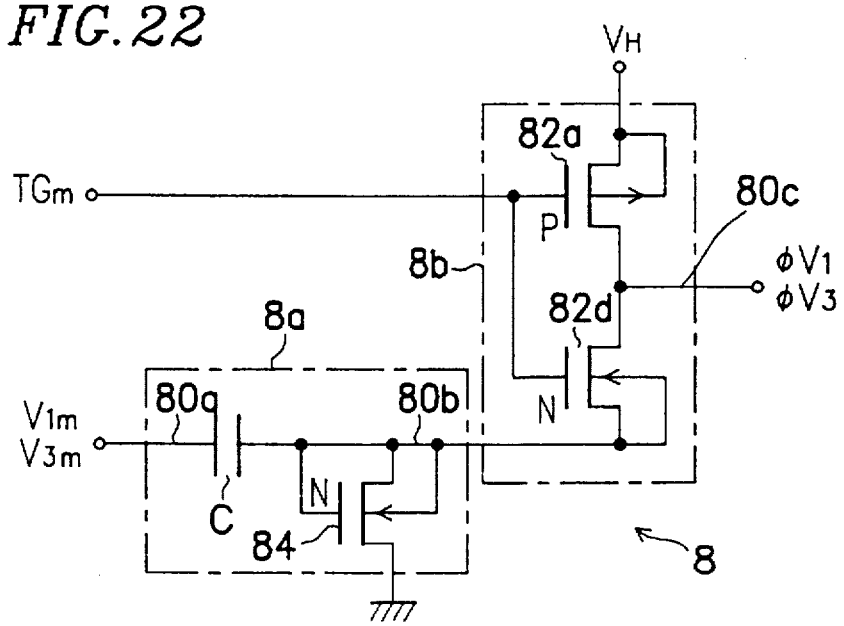

FIG. 22 shows another exemplary structure of the clamp portion 8a of the clamp/adder circuit 8 utilizing a N-channel MOSFET 84 instead of the diode 81. Gate and drain terminals of the N-channel MOSFET 84 are connected to the output line 80b and a source terminal thereof is grounded. The structure of the clamp portion 8a is not limited to these examples, however. The clamp portion 8a can be implemented using a peak clamping circuit or other kind of clamping circuit.

As described above, the driver circuit 1 of the present invention generates the driving signals (for example, $\phi V_2$ and $\phi V_4$) having binary peak levels including a negative level ($-V_L$) by clamping the input timing pulse signals after amplifying the timing pulse signals, using the power supply 4 which supplies a single positive voltage level ($V_H$). A negative voltage ($-V_L$) which has a polarization opposite to that of the supply voltage ($V_H$) and the input timing pulse signals can be obtained by generating an intermediate voltage ($V_L$) from the supply voltage ($V_H$) using the voltage divider 9.

In this embodiment, pulse signals (modulated signals) are clamped using a ground voltage (0V) in the clamping circuit 7 and the clamp portion 8a of the clamp/adder circuit 8. However, a clamping voltage is not limited to the ground voltage. The clamping voltage can be selected between the ground voltage and the intermediated voltage $V_L$ which is obtained by the voltage divider 9. For example, in the case where the clamping voltage is set at $V_c$ (where $0<V_c<V_L$), a pulse signal having peaks at 0V and $V_L$ is shifted to a pulse signal having peaks at $-(V_L-V_c)$ and $V_c$.

Furthermore, by adding a signal having a positive voltage level (for example, $V_H$) to the binary signal having peaks at a negative voltage level (for example, $-V_L$) obtained as described above, a trinary driving pulse signal having the negative level ($-V_L$) and the positive level ($V_H$), and an intermediate level (0V), is generated (for example, $\phi V_1$ and $\phi V_3$). Adding the signals (for example, the modulated signal $V_{m1}$ and the DC voltage signal $V_H$) is performed by selectively output these signals based on a predetermined timing (for example, the modulated signal $TG_m$) so as to generate the driving signal (for example, $\phi V_1$). In the case where the clamping voltage is set at $V_c$, as described above, the trinary signal has a negative level at $V_c-V_L$ and a positive level at $V_H$, and an intermediate level at $V_c$, for example.

In this embodiment, a positive level of a DC supply voltage is added to a binary signal having one peak at a negative level so as to generate a trinary signal having positive, negative, and intermediate levels. Nevertheless, a signal having peaks at one or more positive levels can be added to the binary signal having one peak at a negative level. For example, a binary signal having peaks at respective positive levels can be added, which can be generated using a power supply for supplying a single positive voltage, so as to generate a driving signal having four levels including a negative level. As will be appreciated, according to the present invention, a driving signal having multi-levels including at least one negative level can be generated by clamping and adding operations using a power supply for supplying a single positive voltage.

In this embodiment, the driving circuit utilizes a power supply for supplying a single positive voltage in order to generate a driving signal having multi-levels including at least one negative level. However, the power supply is not limited to this. The driving circuit of the present invention can utilize a power supply for supplying a single negative voltage in order to generate a driving signal having multi-levels including at least one positive level, in a similar manner as that described above. According to the present invention, a driving signal having a plurality of levels including positive and negative levels can be generated by utilizing a power supply for supplying a single voltage level (positive or negative).

EXAMPLE 2

Figure 23:
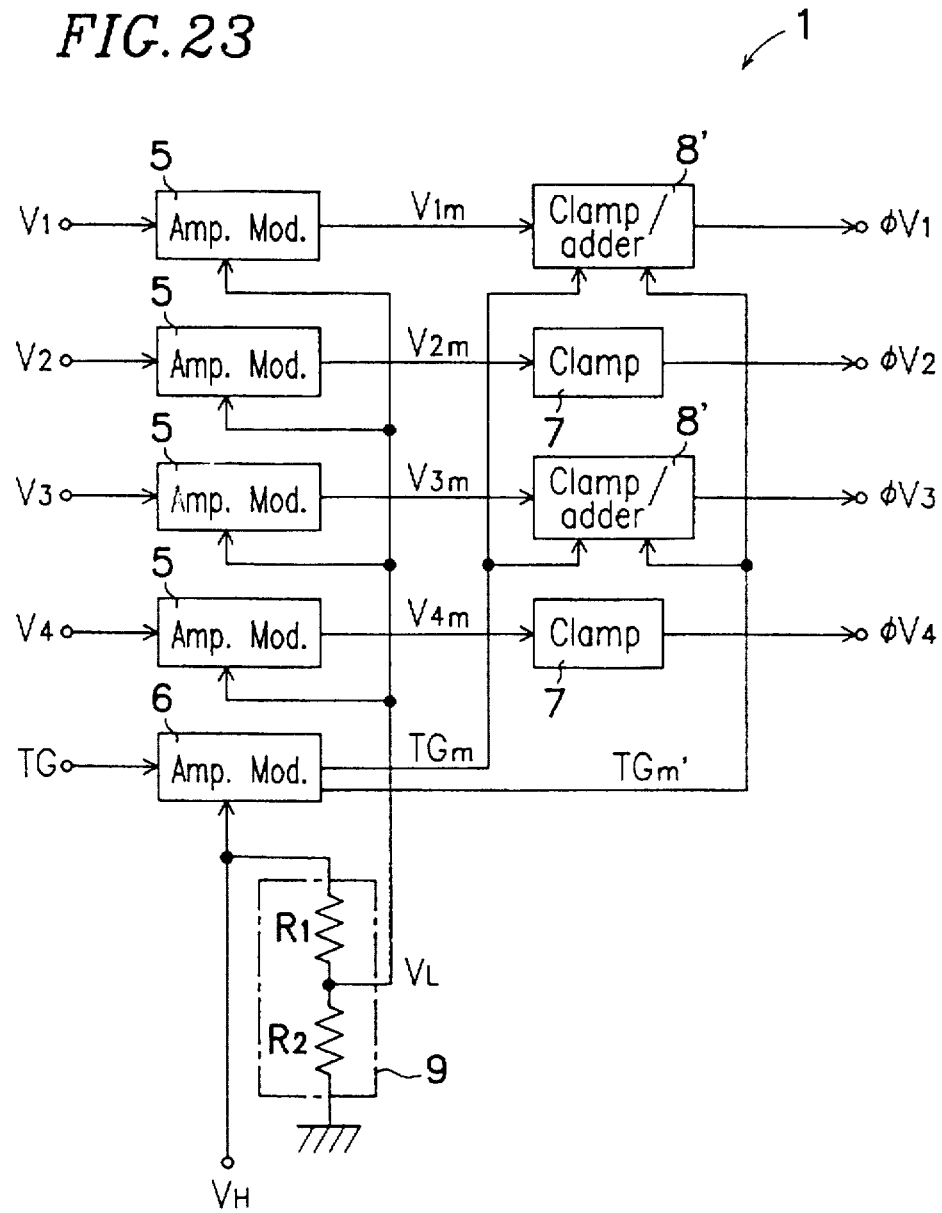
FIG. 23 is a block diagram showing a structure of the driver circuit according to another embodiment of the present invention.

FIG. 23 shows an exemplary structure of the driver circuit 1 of another embodiment of the present invention. As shown in FIG. 23, the driver circuit 1 includes first amplitude modulators 5, each provided for receiving one of the timing pulse signals $V_1-V_4$, a second amplitude modulator 6 for receiving the timing pulse signal TG, clamping circuits 7, clamp/adder circuits 8', and a voltage divider 9. A positive voltage ($V_H$) from the power supply 4 (shown in FIG. 9) is supplied to the second amplitude modulator 6 and one terminal of the voltage divider 9. An output (intermediate voltage $V_L$) of the voltage divider 9 is supplied to the first amplitude modulators 5.

The timing pulse signals $V_1-V_4$ from the timing circuit 2 are input to the corresponding first amplitude modulators 5. The first amplitude modulators 5 transform the timing pulse signals $V_1-V_4$ into respective modulated signals $V_{1m}-V_{4m}$ which have a predetermined amplitude having peaks at 0V and $V_L$, using the intermediate voltage $V_L$ supplied from the voltage divider 9. The modulated signals $V_{1m}$ and $V_{3m}$ are input to the corresponding clamp/adder circuits 8', and the modulated signals $V_{2m}$ and $V_{4m}$ are input to the corresponding clamping circuits 7.

The timing pulse signal TG is input to the second amplitude modulator 6. The structure of the second amplitude modulator 6 of this embodiment is the same as that in the first embodiment shown in FIG. 13. The second amplitude modulator 6 generates first and second modulated signals $TG_m$ and $TG_m'$ based on the timing pulse signal TG and using the positive voltage $V_H$ supplied from the power supply 4, in the same manner as discussed above in Example 1. The first and second modulated signals $TG_m$ and $TG_m'$ have a predetermined amplitude between peaks at 0V and $V_H$.

As shown in FIG. 13, in the second amplitude modulator 6, the first modulated signal $TG_m$ is generated by amplifying and inverting the timing pulse signal TG via the first CMOS inverter 60a. That is, the first modulated signal $TG_m$ goes high when the timing pulse signal goes low and vice versa. The first modulated signal $TG_m$ is output from a node 61 of the second amplitude modulator 6 and input to the clamp/adder circuits 8', as shown in FIG. 23.

The second modulated signal $TG_m'$, as shown in FIG. 13, is generated by inverting the first modulated signal $TG_m$ via the second CMOS inverter 60b. That is, the second modulated signal $TG_m'$ has the same phase as that of the input timing pulse signal TG and is amplified from a logic level (5V) of the input timing pulse signal TG to the predetermined positive level $V_H$. The second modulated signal $TG_m'$ is output from a node 62 of the second amplitude modulator 6 and input to the clamp/adder circuits 8', as shown in FIG. 23.

In FIG. 23, the outputs from the clamping circuits 7 are the driving signals $\phi V_2$ and $\phi V_4$ which are used for transferring electric charges in the vertical CCDs. The outputs from the clamp/adder circuits 8' are the driving signals $\phi V_1$ and $\phi V_3$ used for transferring electric charges in the vertical CCDs and reading photoelectric charges from the diodes to the vertical CCDs.

As shown in FIG. 23, the voltage divider 9 includes resistors $R_1$ and $R_2$ connected in a series, one terminal being coupled to the positive voltage $V_H$, the other being grounded at 0V. The intermediate voltage $V_L$, which is obtained by division of the positive voltage $V_H$, is output from a connecting node of the resistors $R_1$ and $R_2$ so as to be input to the first amplitude modulators 5.

The respective structures of the first amplitude modulator 5 and the clamping circuit 7 are the same as those discussed above in Example 1, for example, as shown in FIGS. 11 and 14–16. The operations of the first amplitude modulator 5 and the clamping circuit 7 are also the same as those discussed above in Example 1. The timing pulse signals $V_1-V_4$ which are input to the first amplitude modulators 5 and the modulated signals $V_{1m}-V_{4m}$ which are output from the first amplitude modulators 5 are shown in FIG. 12, being the same as those in Example 1. The driving signals $\phi V1-\phi V4$ output from clamping circuits 7 and clamp/adder circuits 8' are also shown in FIG. 12, being the same as those in Example 1.

Figure 24:
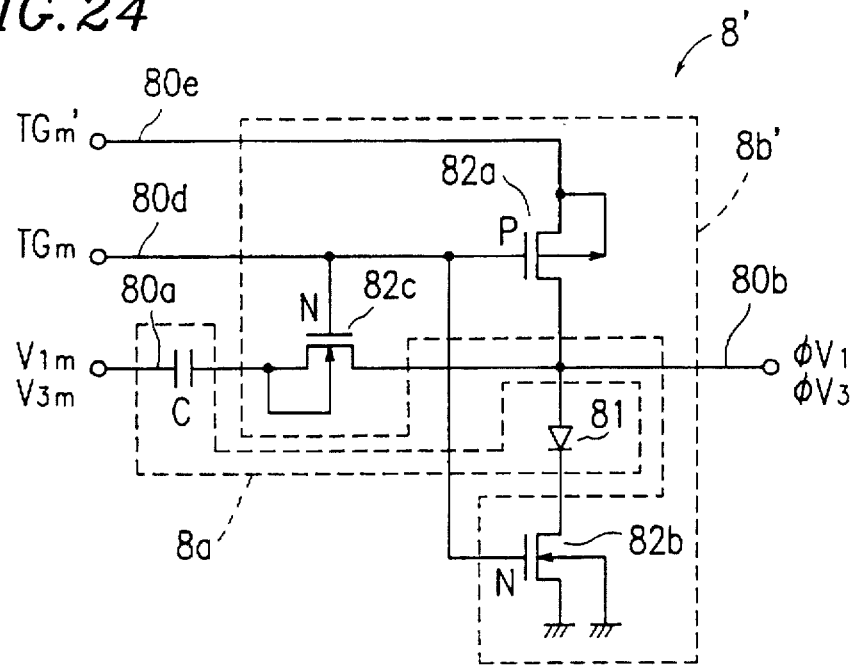
FIG. 24 is a schematic diagram showing an exemplary structure of a clamp/adder circuit of the driver circuit according to another embodiment of the present invention.

FIG. 24 shows an exemplary structure of the clamp/adder circuit 8' according the second embodiment of the present invention represented in FIG. 23. As shown in FIG. 24, the clamp/adder circuit 8' includes a clamp portion 8a and a pulse adder portion 8b'. The modulated signal $V_{1m}$ or $V_{3m}$ is input to an input line 80a of the clamp portion 8a. The first modulated signal $TG_m$ from the node 61 of the second amplitude modulator 6 is input to an input line 80d of the pulse adder portion 8b', while the second modulated signal $TG_m'$ from the node 62 of the second amplitude modulator 6 is input to another input line 80e of the pulse adder portion 8b'.

The clamp portion 8a has a structure similar to that of the clamping circuit 7 as described in Example 1 with reference to FIG. 14, including a capacitor C provided between an input line 80a and an output line 80b, and a diode 81 connected to the output line 80b. An N-channel MOSFET 82c of the pulse adder portion 8b' is inserted between the capacitor C and the diode 81. A capacitance of the capacitor C in the clamp portion 8a is about 0.1 µF or more, as in the case of the clamping circuit 7.

As shown in FIG. 24, the pulse adder portion 8b' includes a P-channel MOSFET 82a and two N-channel MOSFETs 82b and 82c. The P-channel MOSFET 82a controls the electric connection between the output line 80b and the input line 80e to which the second modulated signal $TG_m'$ is supplied. The second modulated signal $TG_m'$ is output from the node 62 of the second amplitude modulator 6, having peaks at a positive level $V_H$ and a ground level (0V). The N-channel MOSFET 82b controls the electric connection between a cathode of the diode 81 of the clamp portion 8a and the ground voltage (0V). The N-channel MOSFET 82c controls the electric connection between the capacitor C of the clamp portion 8a and the output line 80b.

Respective gate terminals of the MOSFETs 82a–82c are connected to the input line 80d so as to be supplied with the first modulated signal $TG_m$ which is output from the node 61 of the second amplitude modulator 6. During the transfer period, the first modulated signal $TG_m$ goes high ($V_H$) as the timing pulse signal TG goes low (0V), as shown in FIG. 12, so that the P-channel MOSFET 82a is turned off and the N-channel MOSFETs 82b and 82c are turned on. Accordingly, the structure of the clamp portion 8a becomes the same as that of the clamping circuit 7, in which the output of the capacitor C is coupled to the output line 80b to which an anode of the diode 81 is connected, and the cathode of the diode 81 is grounded.

As described above, in the transfer period, the clamp portion 8a operates in the same manner as the clamping circuit 7. The clamp portion 8a couples an AC component of the corresponding modulated signal ($V_{1m}$ or $V_{3m}$) which is input to the input line 80a having an amplitude of $V_L$ via the capacitor C. A DC component of the modulated signal is clamped by the diode 81 in the same manner as by the diode 71 in the clamping circuit 7. Accordingly, the signal on the output line 80b has peaks at levels of $-V_L$ and 0V, and is output as a driving signal $\phi V_1$ or $\phi V_3$.

In the read-out period, as shown in FIG. 12, the first modulated signal $TG_m$ goes low ($V_L$) as the timing pulse signal TG goes high (5V). Thus, during the read-out period, the P-channel MOSFET 82a is turned on and the N-channel MOSFETs 82b and 82c are turned off. Since the second modulated signal $TG_m'$ goes high ($V_H$) in the read-out period, the positive level $V_H$ of the second modulated signal $TG_m'$ is output to the output line 80b via the P-channel MOSFET 82a. Accordingly, the signal having a peak level at $V_H$ is output from the output line 80b as the driving signal $\phi V_1$ or $\phi V_3$ during the read-out period.

Consequently, the driving signals $\phi V_1$ and $\phi V_3$ which are output from the clamp/adder circuits 8' are trinary pulse signals having a negative level $(-V_L)$ and a positive level $(V_H)$, and an intermediate level (0V), as shown in FIG. 12.

Figure 25:
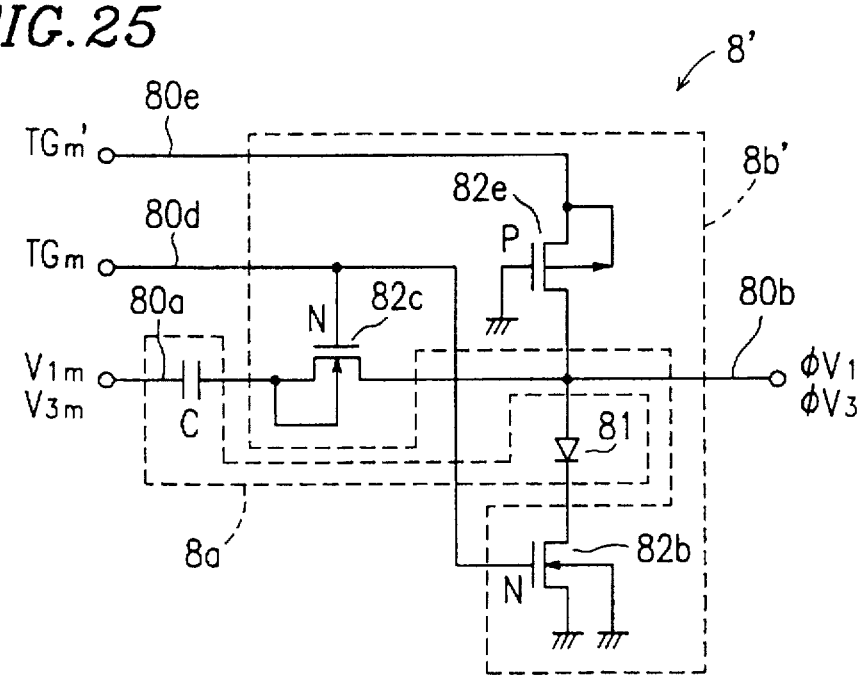
FIG. 25 is a schematic diagram showing another exemplary structure of the clamp/adder circuit of the driver circuit according to another embodiment of the present invention.

In the clamp/adder circuit 8' described above, the pulse adder portion 8b' can be implemented using a P-channel MOSFET 82e, a gate of which is grounded, instead of the P-channel MOSFET 82a, as shown in FIG. 25.

Figure 26:
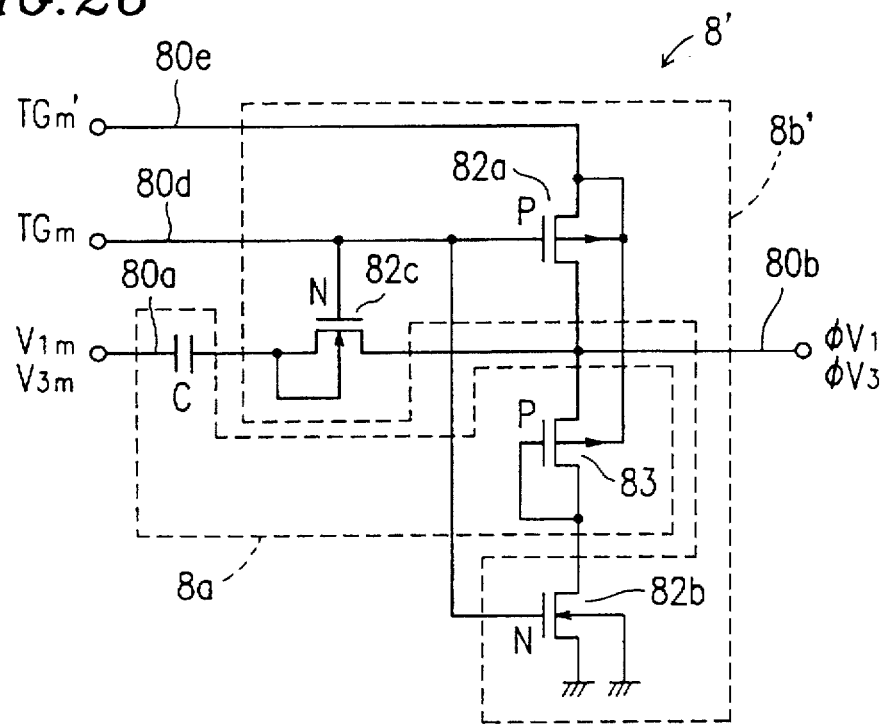
FIG. 26 is a schematic diagram showing still another exemplary structure of the clamp/adder circuit of the driver circuit according to another embodiment of the present invention.
Figure 27:
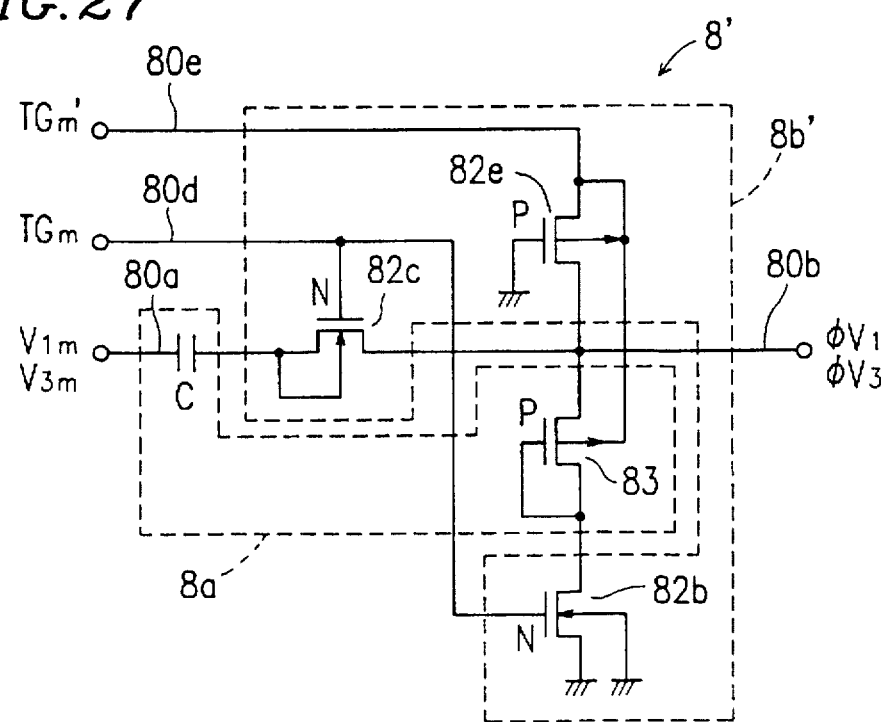
FIGS. 27–35 are schematic diagrams showing other exemplary structures of the clamp/adder circuit of the driver circuit according to another embodiment of the present invention.

The clamp portion 8a of the clamp/adder circuit 8' can be implemented using other semiconductor devices such as MOSFETs. For example, as shown in FIG. 26, the clamp portion 8a can utilize a P-channel MOSFET 83 instead of the diode 81. Gate and drain terminals of the P-channel MOSFET 83 are grounded via the N-channel MOSFET 82b, and a source terminal thereof is connected to the output line 80b. In this example also, the pulse adder portion 8b' can be implemented using a P-channel MOSFET 82e, a gate of which is grounded, instead of the P-channel MOSFET 82a, as shown in FIG. 27.

Figure 28:
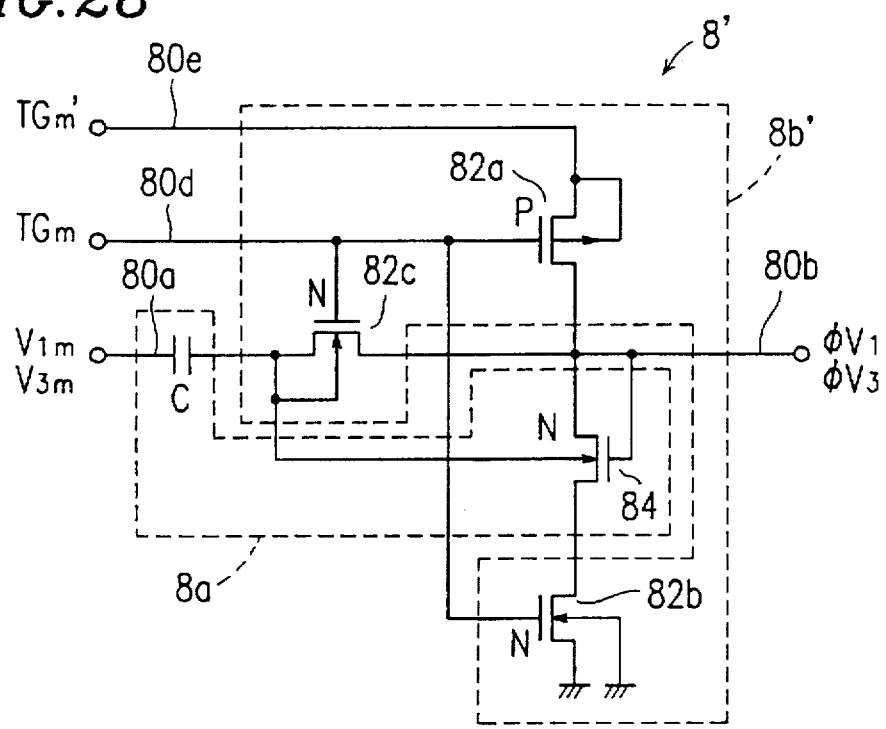
Figure 29:
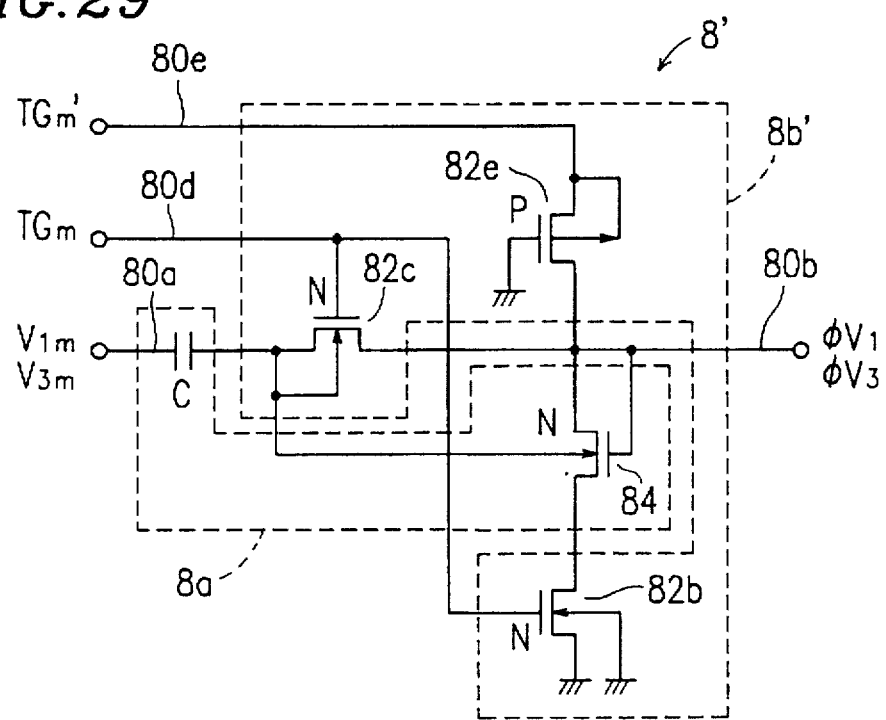

FIG. 28 shows another exemplary structure of the clamp portion 8a of the clamp/adder circuit 8'. In such instance, an N-channel MOSFET 84 is utilized instead of the diode 81. Gate and drain terminals of the N-channel MOSFET 84 are connected to the output line 80b, and a source terminal thereof is grounded via the N-channel MOSFET 82b. In this example also, the pulse adder portion 8b' can be implemented using a P-channel MOSFET 82e, a gate of which is grounded, instead of the P-channel MOSFET 82a, as shown in FIG. 29.

The structure of the clamp portion 8a is not limited to these examples. The clamp portion 8a can be implemented using a peak clamping circuit or other kind of clamping circuit as will be appreciated.

Figure 30:
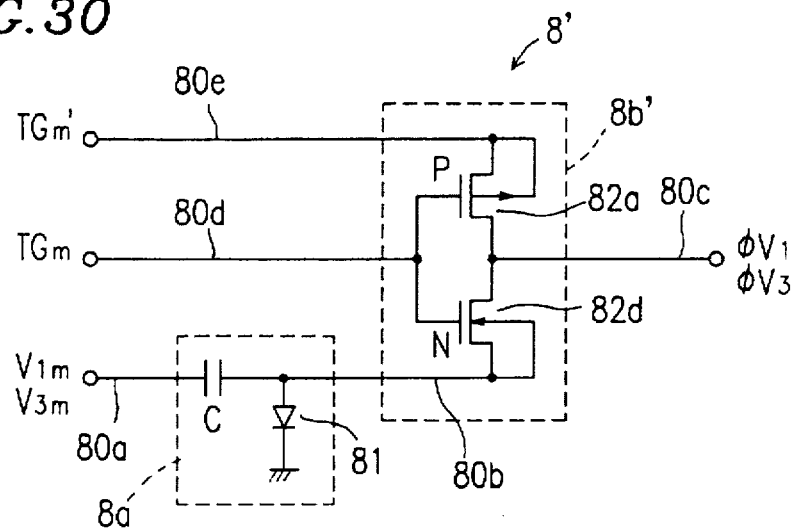

FIG. 30 shows another exemplary structure of the clamp/adder circuit 8' according the second embodiment of the present invention. As shown in FIG. 30, the clamp/adder circuit 8' includes a clamp portion 8a and a pulse adder portion 8b'. The pulse adder portion 8b' is formed utilizing a P-channel MOSFET 82a and an N-channel MOSFET 82d.

The modulated signal $V_{1m}$ or $V_{3m}$ is input to an input line 80a of the clamp portion 8a. The first modulated signal $TG_m$ from the node 61 of the second amplitude modulator 6 is input to an input line 80d of the pulse adder portion 8b'. The second modulated signal $TG_m'$ from the node 62 of the second amplitude modulator 6 is input to another input line 80e of the pulse adder portion 8b'.

The clamp portion 8a has a similar structure as that of the clamping circuit 7 as described in Example 1 with reference to FIG. 14, including a capacitor C provided between an input line 80a and an output line 80b, and a diode 81 connected to the output line 80b. The output line 80b is connected to a source terminal of the N-channel MOSFET 82d of the pulse adder portion 8b'. A capacitance of the capacitor C in the clamp portion 8a is about 0.1 µF or more, as in the case of the clamping circuit 7.

In the pulse adder portion 8b', a source terminal of the P-channel MOSFET 82a is connected to the input line 80e to which the second modulated signal $TG_m'$ is supplied from the node 62 of the second amplitude modulator 6. Respective drain terminals of the P-channel MOSFET 82a and the N-channel MOSFET 82d are connected to an output line 80c. Respective gate terminals of the P-channel MOSFET 82a and the N-channel MOSFET 82d are connected to the input line 80d to which the first modulated signal $TG_m$ is supplied from the node 61 of the second amplitude modulator 6.

During the transfer period, the first modulated signal $TG_m$ goes high ($V_H$) as the timing pulse signal TG goes low (0V), as shown in FIG. 12, so that the P-channel MOSFET 82a is turned off and the N-channel MOSFET 82d is turned on.

Thus, the signal on the output line 80b which is output from the clamp portion 8a is output to the output line 80c via the N-channel MOSFET 82d.

As described above, in the transfer period, the clamp portion 8a operates in the same manner as the clamping circuit 7. The clamp portion 8a couples an AC component of the corresponding modulated signal ($V_{1m}$ or $V_{3m}$) which is input to the input line 80a having an amplitude of $V_L$ via the capacitor C. A DC component of the modulated signal is clamped by the diode 81 in the same manner as by the diode 71 in the clamping circuit 7. Accordingly, the signal on the output line 80b has peaks at levels of $-V_L$ and 0V, and is output as driving signal $\phi V_1$ or $\phi V_3$ from the output line 80c.

In the read-out period, as shown in FIG. 12, the first modulated signal $TG_m$ goes low ($V_L$) as the timing pulse signal TG goes high (5V). Thus, during the read-out period, the P-channel MOSFET 82a is turned on and the N-channel MOSFET 82d is turned off. Since the second modulated signal $TG_m'$ goes high ($V_H$) in the read-out period, the positive level $V_H$ of the second modulated signal $TG_m'$ is output to the output line 80c via the P-channel MOSFET 82a. Accordingly, the signal having a peak level at $V_H$ is output from the output line 80c as the driving signal $\phi V_1$ or $\phi V_3$ during the read-out period.

Consequently, the driving signals $\phi V_1$ and $\phi V_3$ output from the clamp/adder circuits 8' are trinary pulse signals each having a negative level ($-V_L$) and a positive level ($V_H$), and an intermediate level (0V), as shown in FIG. 12.

Figure 31:
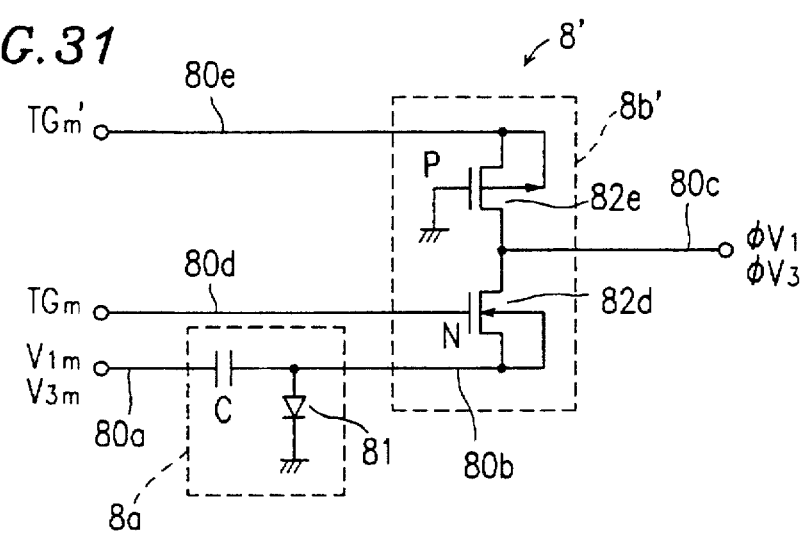

In the clamp/adder circuit 8', described above, the pulse adder portion 8b' can be implemented using a P-channel MOSFET 82e, a gate of which is grounded, instead of the P-channel MOSFET 82a, as shown in FIG. 31.

Figure 32:
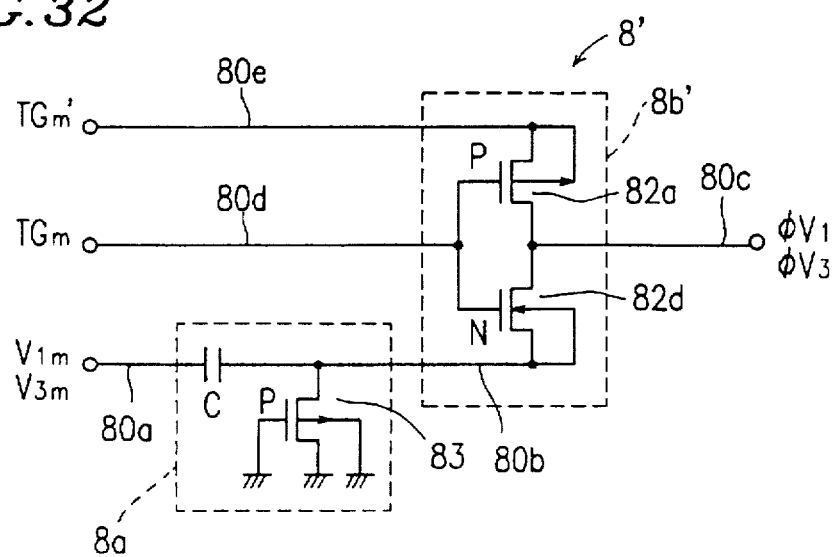
Figure 33:
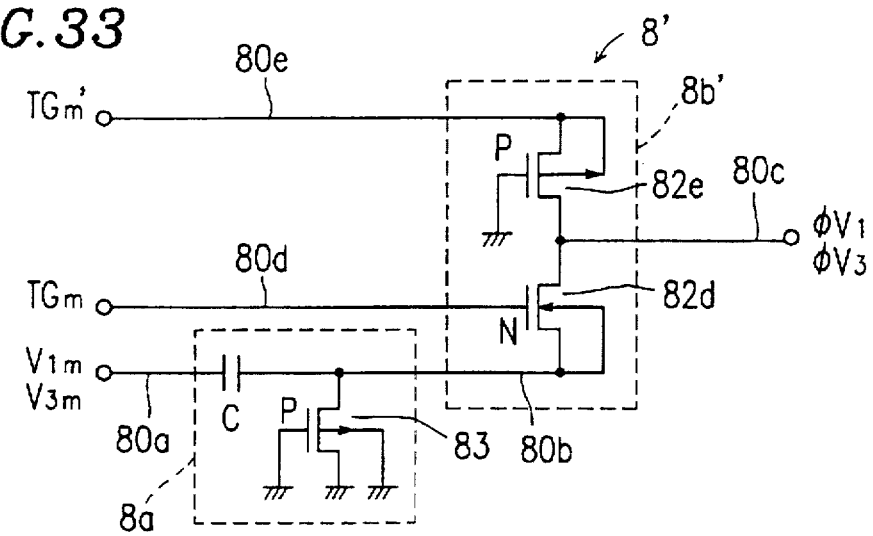

The clamp portion 8a of the clamp/adder circuit 8' can be implemented using other semiconductor devices, such as MOSFETs, rather than the diode 81, in a similar way as the clamping circuit 7. For example, as shown in FIG. 32, the clamp portion 8a can utilize a P-channel MOSFET 83 instead of the diode 81. Gate and drain terminals of the P-channel MOSFET 83 are grounded, and a source terminal thereof is connected to the output line 80b. In this example also, the pulse adder portion 8b' can be implemented using a P-channel MOSFET 82e, a gate of which is grounded, instead of the P-channel MOSFET 82a, as shown in FIG. 33.

Figure 34:
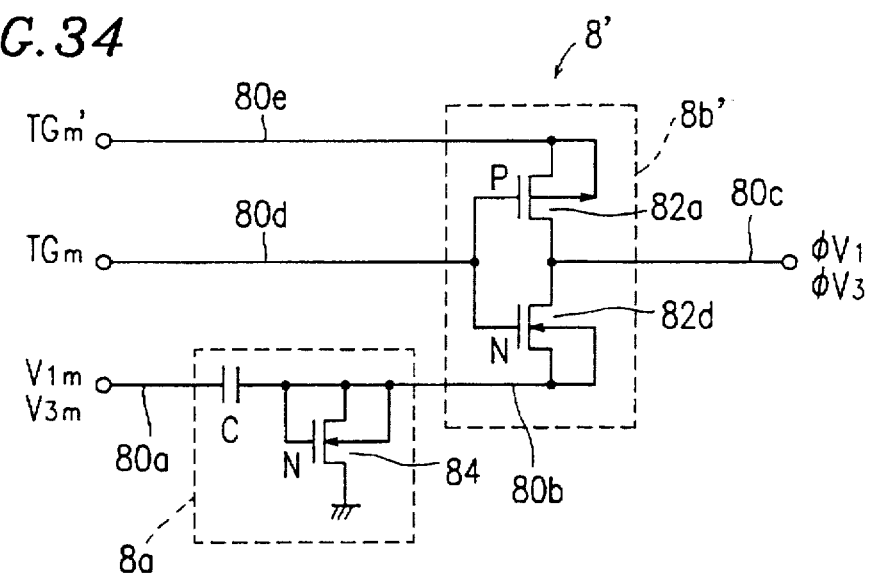
Figure 35:
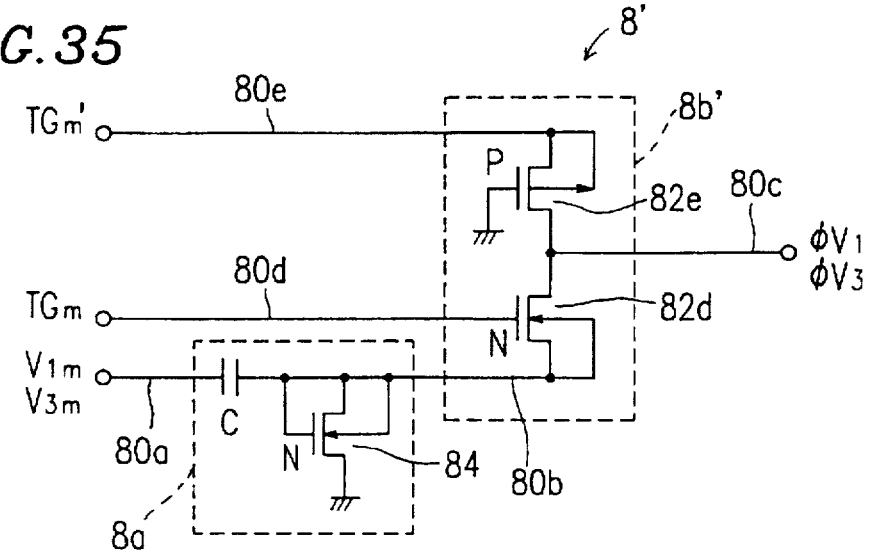

FIG. 34 shows another exemplary structure of the clamp portion 8a of the clamp/adder circuit 8, in which an N-channel MOSFET 84 is utilized instead of the diode 81. Gate and drain terminals of the N-channel MOSFET 84 are connected to the output line 80b and a source terminal thereof is grounded. In this example also, the pulse adder portion 8b' can be implemented using a P-channel MOSFET 82e, a gate of which is grounded, instead of the P-channel MOSFET 82a, as shown in FIG. 35.

The structure of the clamp portion 8a is not limited to these examples. The clamp portion 8a can be implemented using a peak clamping circuit or other clamping circuit as will be appreciated.

As described above, the driver circuit 1 according to this embodiment of the present invention generates the driving signals (for example, $\phi V_2$ and $\phi V_4$) having binary peak levels including a negative level ($-V_L$) by clamping the input timing pulse signals after amplifying the input timing pulse signals, using the power supply 4 which supplies a single positive voltage level ($V_H$). A negative voltage ($-V_L$) which has a polarization opposite to that of the supply voltage ($V_H$) and the input timing pulse signals can be obtained by generating an intermediate voltage ($V_L$) from the supply voltage ($V_H$) using the voltage divider 9.

In this embodiment, as is in the first embodiment described above, pulse signals (modulated signals) are clamped using a ground voltage (0V) in the clamping circuit 7 and in the clamp portion 8a of the clamp/adder circuit 8'. However, a clamping voltage is not limited to the ground voltage. The clamping voltage can be selected between the ground voltage and the intermediate voltage $V_L$ which is obtained by the voltage divider 9. For example, in the case where the clamping voltage is set at $V_c$ (where, $0<V_c<V_L$), a pulse signal having peaks at 0V and $V_L$ is shifted to a pulse signal having peaks at $-(V_L-V_c)$ and $V_c$.

Furthermore, by adding a pulse signal having peaks at a positive voltage level (for example, the second modulated signal $TG_m'$ having peaks at $V_H$) to the binary signal having peaks at a negative voltage level (for example, $-V_L$), a trinary driving pulse signal having the negative level $(-V_L)$, an intermediate level (0V), and the positive level $(V_H)$ is generated (for example, $\phi V_1$ and $\phi V_3$). Adding the signals (for example, the modulated signal $V_{m1}$ and the DC voltage signal $V_H$) is performed by selectively output these signals based on a predetermined timing (for example, the modulated signal $TG_m$) so as to generate the driving signal (for example, $\phi V_1$). In the case where the clamping voltage is set at $V_c$ as described above, the trinary signal has a negative level at $V_c-V_L$, an intermediate level at $V_c$, and a positive level at $V_H$, for example.

In this embodiment, a pulse signal having peaks at a positive level is supplied to the clamp/adder circuits instead of supplying a DC supply voltage. This prevents latch-up of the transistors in the clamp/adder circuits.

A signal having peaks at two or more positive levels can be added to the binary signal having one peak at a negative level in the clamp/pulse circuits. For example, a signal having peaks at respective positive levels can be added, which can be generated using a power supply for supplying a single positive voltage, so as to generate a driving signal having a plurality of levels including a negative level. As appreciated, according to the present invention, a driving signal having multi-levels including at least one negative level can be generated by clamping and adding operations using a power supply for supplying a single positive voltage.

The power supply is not limited to this. The driving circuit of the present invention can utilize a power supply for supplying a single negative voltage in order to generate a driving signal having multi-levels including at least one positive level, in a similar manner as that described above. Thus, a driving signal having a plurality of levels including positive and negative levels can be generated by utilizing a power supply for supplying a single voltage level (positive or negative).

EXAMPLE 3

The driver circuit 1 of the present invention can be integrated by itself, or can be integrated with the CCD type camera device 3. In this embodiment, an exemplary structure of the driver circuit 1 which is integrated with the CCD type camera device 3 is described.

Figure 36:
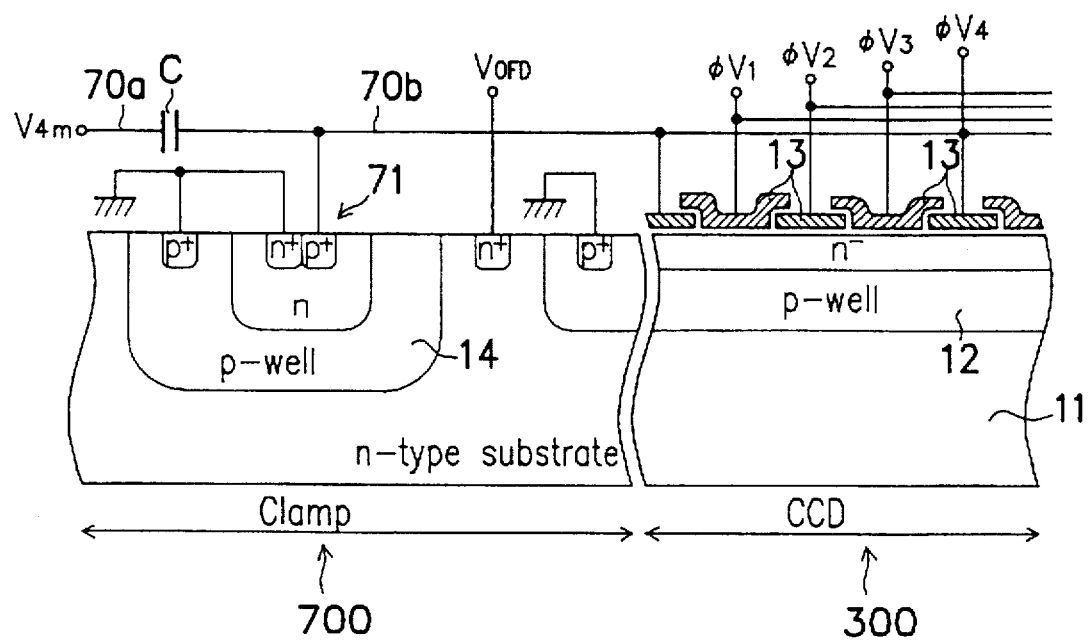
FIG. 36 is a cross-sectional view illustrating an exemplary structure of the clamping circuit formed on a substrate according to one embodiment of the present invention.

FIG. 36 shows a portion of a n-type substrate 11 of an IC in which the clamping circuit 7 utilizing the diode 71 (shown in FIG. 14) of the driver circuit 1 is integrated with the CCD type camera device 3. In FIG. 36, the clamping circuit 7 for generating the driving signal $\phi V_4$ is explained as an example.

As shown in FIG. 36, the n-type substrate 11 includes a CCD region 300 for forming the CCD type camera device and a clamping circuit region 700. A shallow p-well 12 which is doped with impurities at a relatively low density is formed in the CCD region 300. A deep p-well 14 which is doped with impurities at a relatively high density is formed in the clamping circuit region 700.

In the CCD region 300, driving electrodes 13 are formed on a surface of the p-well 12 via an oxide film (not shown). Driving electrodes 13 are supplied with the respective driving signals $\phi V_1-\phi V_4$. The n-type substrate 11 is supplied with a positive voltage $V_{OFD}$.

In the clamping circuit region 700 of the n-type substrate 11, the diode 71 having pn junction is formed in the p-well 14. As shown in FIG. 36, the cathode of the diode 71 is grounded, and the anode thereof is connected to the output line 70b from the capacitor C. In this example, the capacitor C may be formed in a peripheral circuit or in another portion (not shown) in the n-type substrate 11. The modified signal $V_{4m}$ is supplied to the capacitor C via the input line 70a. In the same manner as discussed in Example 1, the driving signal $\phi V_4$ is output from the output line 70b so as to be applied to the corresponding driving electrodes 13.

Figure 37:
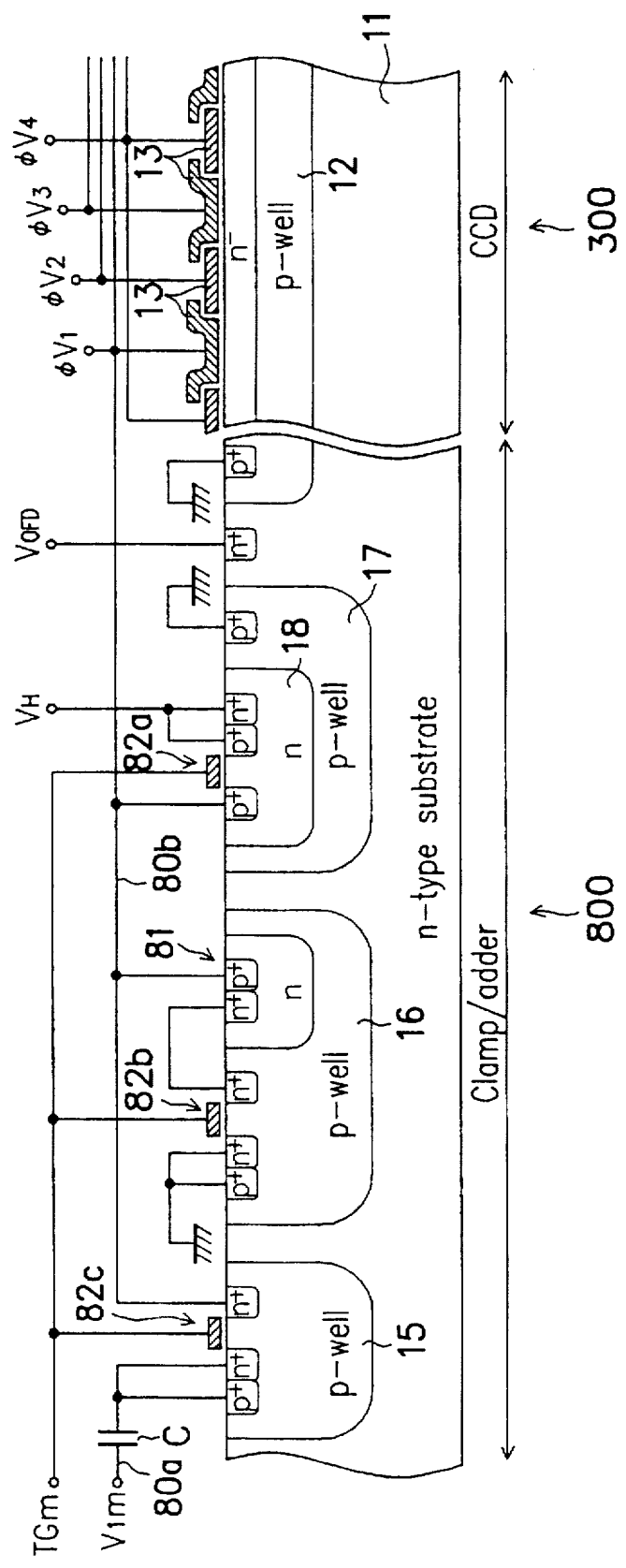
FIG. 37 is a cross-sectional view illustrating an exemplary structure of the clamp/adder circuit formed on a substrate according to one embodiment of the present invention.

FIG. 37 shows a portion of a n-type substrate 11 in which the clamp/adder circuit 8 utilizing the diode 81 (shown in FIG. 17) of the driver circuit 1 is integrated with the CCD type camera device 3. In FIG. 37, the clamp/adder circuit 8 for generating the driving signal $\phi V_1$ is explained as an example.

As shown in FIG. 37, the n-type substrate 11 includes a CCD region 300 for forming the CCD type camera device 3 and a clamp/adder circuit region 800 for forming the clamp/adder circuit 8. A shallow p-well 12 which is doped with impurities at a relatively low concentration is formed in the CCD region 300. Deep p-wells 15–17 which are doped with impurities at a relatively high concentration are formed in the clamp/adder circuit region 800, corresponding to elements of the clamp/adder circuit 8.

In the CCD region 300, driving electrodes 13 are formed on a surface of the p-well 12 via an oxide film not shown). Driving electrodes 13 are supplied with the respective driving signals $\phi V_1-V_4$. The n-type substrate 11 is supplied with a positive voltage $V_{OFD}$.

As shown in FIG. 37, in the clamp/adder circuit region 800 of the n-type substrate 11, the N-channel MOSFET 82c is formed in the p-well 15, the N-channel MOSFET 82b and the diode 81 having pn junction are formed in the p-well 16, and the P-channel MOSFET 82a is formed in a n-well 18 formed the p-well 17.

The modified signal $V_{1m}$ is supplied to the capacitor C via the input line 80a. In this example, the capacitor C may be formed in a peripheral circuit or in another portion (not shown) in the n-type substrate 11. The capacitor C is connected to the source terminal of the N-channel MOSFET 82c. The drain terminal of the N-channel MOSFET 82c is connected to the output line 80b. The output line 80b is supplied with the positive supply voltage $V_H$ via the P-channel MOSFET 82a which is formed in the n-well 18 in the p-well 17. The respective gate terminals of the MOSFETs 82a–82c are supplied with the modulated signal $TG_m$. In the same manner as discussed in Example 1, the driving signal $\phi V_1$ is output from the output line 80b so as to be applied to the corresponding driving electrodes 13 and terminals of the output gate (not shown).

In both the examples shown in FIGS. 36 and 37, the p-well 12 in the CCD region 300 is formed shallow with a low impurity concentration in order to release excessive electric charges in photo-diodes (not shown) to the n-type substrate 11 via a punchthrough effect caused by increasing the positive voltage $V_{OFD}$ applied to the n-type substrate 11. On the other hand, p-wells 14–17 in the clamping circuit region 700 and the clamp/adder circuit region 800 are formed deep with a relatively high impurity concentration in order not to be subject to the punchthrough effect since MOSFETs and the like are formed therein. Thus, for example, the p-well 12 is formed so as to have a carrier density of about $10^{14}$ cm$^{-3}$ and a junction depth of about 2 μm, and the p-wells 14–17 are formed so as to have a carrier density of about $10^{15}$ cm$^{-3}$ and a junction depth of about 4 μm or more.

As shown in FIG. 37, the depth and impurity concentration of the p-wells 15–17 in the clamp/adder region 800 can be the same. The p-wells 16 and 17 may be formed in one common well since voltage levels thereof are the same at 0V. The p-well 15 is formed so as to be isolated from other p-wells since the voltage level of the p-well 15 is different.

In the case where a latch-up effect may be caused in the N-channel MOSFET 82b in the p-well 16 and the P-channel MOSFET 82a in the n-well 18 and in the p-well 17 by forming the p-wells 16 and 17 in a one common well, the p-wells 16 and 17 should be formed separately.

As described above, the driver circuit according to the present invention generates the driving signals (for example, $\phi V_2$ and $\phi V_4$) having binary peak levels including a negative level $(-V_L)$ by clamping the input timing pulse signals after amplifying the timing pulse signals, using the power supply which supplies a single positive voltage level $(V_H)$. A negative voltage $(-V_L)$ which has a polarization opposite to that of the supply voltage $(V_H)$ can be obtained by generating an intermediate voltage $(V_L)$ from the supply voltage $(V_H)$ using the voltage divider.

The clamping voltage used in the clamping circuit and the clamp/adder circuit can be set at $V_c$ between the ground voltage (0V) and the intermediate voltage $(V_L)$ obtained from the voltage divider as described above. In this case, the trinary signal has a negative level at $V_c-V_L$, an intermediate level at $V_c$, and a positive level at $V_H$, for example.

By adding a signal having a positive voltage level (for example, $V_H$) to the binary signal having peaks at a negative voltage level (for example, $-V_L$), as described above, a trinary driving pulse signal having the negative level $(-V_L)$, the intermediate level (0V), and the positive level $(V_H)$ is generated (for example, $\phi V_1$ and $\phi V_3$). Adding the signals (for example, the modulated signal $V_{m1}$ and the DC voltage signal $V_H$) is performed by selectively output one of these signals based on a predetermined timing (for example, the modulated signal $TG_m$) so as to generate the driving signal (for example, $\phi V_1$).

As the signal having the positive voltage level $(V_H)$, a positive DC supply voltage $(V_H)$ and a signal having peaks at one or more positive levels can be used. As described above, according to the present invention, a driving signal having multi-levels including at least one negative level can be generated by clamping and adding operations using a power supply for supplying a single positive voltage.

The power supply is not limited to that for supplying a positive voltage level. The driving circuit of the present invention can utilize a power supply for supplying a single negative voltage in order to generate a driving signal having multi-levels including at least one positive level, in a similar manner as that described above. Thus, a driving signal having a plurality of levels including positive and negative levels can be generated by utilizing a power supply for supplying a single voltage level (positive or negative).

As described above, according to the present invention, the driver circuit can generate a multi-level pulse signal including positive and negative levels for driving various devices without requiring an additional supply voltage for generating a voltage signal having an opposite polarization. This makes it possible to reduce the size and cost of the devices. In addition, by integrating the clamping circuit and/or the clamp/adder circuit, for example, with the CCD type camera device, the circuit structure can be simplified.

The present invention is not limited to a driving circuit for CCD type camera devices. Nevertheless, in the case where the present invention is applied to vertical CCDs in the CCD type camera devices, there are many advantages as follows:

In CCD type camera systems, ICs and electrolytic capacitors occupy the most area on the substrate. A respective electrolytic capacitor is necessarily provided to every power supply in order to prevent noises Accordingly, when the power supply includes a positive voltage system and a negative voltage system, it is required to provide electrolytic condensers to the positive and negative voltage systems, respectively.

According to the present invention, the power supply includes only one of either the positive or negative voltage system. This make it possible to reduce in half the number of the electrolytic capacitors so as to miniaturize the camera system and to provide a camera system which is lightweight. In addition, parts for the power supply (e.g., electrolytic capacitors, DC converters, wirings, connectors, and the like) can be eliminated as to reduce the cost of the camera system.

The integrated circuit portion of the camera system includes the CCDs, the driver circuit (driver IC), the timing circuit, and the like. By implementing the power supply in one single voltage system, the structure of the driver circuit also can be simplified so as to reduce the number of IC pins. This makes it possible to reduce the size of the camera system.

Furthermore, the driver circuit can be integrated with the CCDs. An increase of the chip area due to the integration of the driver circuit can be compensated by reducing the area for the power supply. The integration of the driving circuit can still provide the advantage of reducing the size.

In addition, according to the present invention, the CCD camera device can be driven using a single positive (or negative) supply voltage. Thus, DC converters for generating a negative voltage from the positive supply voltage or vice versa are not required. This can reduce the power consumption which is a significant factor for input apparatuses utilizing CCD camera devices such as portable terminal information devices, personal computers, videophones, and the like. According to the present invention, the requirement for reducing power consumption is also satisfied as well as that for reducing the size, weight, and cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A driver circuit for generating a driving pulse signal having a plurality of levels based on an input timing signal using a single supply voltage of a first polarization, the driver circuit including:

means for generating a first voltage from the single supply voltage;

first amplitude modulator means for amplifying the input timing signal using the first voltage, thereby generating a modulated signal having an amplitude of the first voltage; and clamping means for clamping a DC component of the modulated signal so as to be held at a predetermined clamping voltage level, and for substantially maintaining an AC component of the modulated signal, thereby generating a pulse signal having an amplitude substantially the same as that of the AC component of the modulated signal and having a second voltage level of a second polarization opposite to the first polarization.

2. A driver circuit for generating a driving pulse signal having a plurality of levels based on an input timing signal using a single supply voltage of a first polarization, the driver circuit including:

means for generating a first voltage from the single supply voltage;

first amplitude modulator means for amplifying the input timing signal using the first voltage, thereby generating a modulated signal having an amplitude of the first voltage;

clamping means for clamping a DC component of the modulated signal so as to be held at a predetermined clamping voltage level, and for substantially maintaining an AC component of the modulated signal, thereby generating a pulse signal having an amplitude substantially the same as that of the AC component of the modulated signal and having a second voltage level of a second polarization opposite to the first polarization; and wherein the generating means is a voltage divider for generating the first voltage by dividing the single supply voltage and the clamping means uses the predetermined clamping voltage level between a grounded voltage level and the first voltage level.

3. A driver circuit for generating a driving pulse signal having a plurality of levels based on an input timing signal using a single supply voltage of a first polarization, the driver circuit including:

means for generating a first voltage from the single supply voltage;

first amplitude modulator means for amplifying the input timing signal using the first voltage, thereby generating a modulated signal having an amplitude of the first voltage;

clamping means for clamping a DC component of the modulated signal so as to be held at a predetermined clamping voltage level, and for substantially maintaining an AC component of the modulated signal, thereby generating a pulse signal having an amplitude substantially the same as that of the AC component of the modulated signal and having a second voltage level of a second polarization opposite to the first polarization; and adder means for combining a third signal having at least one predetermined voltage level with the pulse signal output from the clamping means so as to generate a driving pulse signal having at least three different levels.

4. A driver circuit according to claim 3, wherein the third signal is a DC voltage signal having the single supply voltage of the first polarization.

5. A driver circuit according to claim 3, wherein the third signal is a pulse signal having levels of the single supply voltage and a grounded voltage.

6. A driver circuit according to claim 3, wherein the adder means includes means for selectively outputting the pulse signal generated by the clamping means and the third signal based on a predetermined timing.

7. A driver circuit according to claim 3, further including second amplitude modulator means for amplifying a second input timing signal using the single supply voltage of the first polarization, thereby generating a second modulated signal having levels of the single supply voltage and a grounded voltage.

8. A driver circuit according to claim 7, wherein the third signal is the second modulated signal.

9. A driver circuit according to claim 2, wherein the predetermined clamping voltage level is the grounded voltage level.

10. A driver circuit according to claim 1, wherein the clamping means is a diode clamping circuit including a capacitor and a diode.

11. A method for generating a driving pulse signal having a plurality of levels based on an input timing signal using a single supply voltage of a first polarization, the method includes the steps of:

generating a first voltage from the single supply voltage;

amplifying the input timing signal using the first voltage, thereby generating a modulated signal having an amplitude of the first voltage; and clamping the modulated signal so that a DC component of the modulated signal is held at a predetermined clamping voltage level, and substantially maintaining an AC component of the modulated signal, thereby generating a pulse signal having an amplitude substantially the same as that of the AC component of the modulated signal and having a second voltage level of a second polarization opposite to the first polarization.

12. A method for generating a driving pulse signal according to claim 11, wherein in the generating step, the first voltage is generated by dividing the single supply voltage, and in the clamping step, a clamping voltage between a grounded voltage level and the first voltage level is used as the predetermined clamping voltage level.

13. A method for generating a driving pulse signal having a plurality of levels based on an input timing signal using a single supply voltage of a first polarization, the method includes the steps of:

generating a first voltage from the single supply voltage;

amplifying the input timing signal using the first voltage, thereby generating a modulated signal having an amplitude of the first voltage;

clamping the modulated signal so that a DC component of the modulated signal is held at a predetermined clamping voltage level, and substantially maintaining an AC component of the modulated signal, thereby generating a pulse signal having an amplitude substantially the same as that of the AC component of the modulated signal and having a second voltage level of a second polarization opposite to the first polarization; and combining a third signal having at least one predetermined voltage level with the pulse signal generated in the clamping step, thereby generating a driving pulse signal having at least three different levels.

14. A method for generating a driving pulse signal according to claim 13, wherein the third signal used in the combining step is a DC voltage signal having the single supply voltage level of the first polarization.

15. A method for generating a driving pulse signal according to claim 13, wherein the third signal used in the combining step is a pulse signal having levels of the single supply voltage and a grounded voltage.

16. A method for generating a driving pulse signal according to claim 13, wherein the combining step includes the step of selectively outputting the pulse signal generated in the clamping step and the third signal based on a predetermined timing.

17. A method for generating a driving pulse signal according to claim 13, further including a step of amplifying a second input timing signal using the single supply voltage of the first polarization, thereby generating a second modulated signal having levels of the single supply voltage and a grounded voltage.

18. A method for generating a driving pulse signal according to claim 17, wherein the third signal used in the combining step is the second modulated signal.

19. A method for generating a driving pulse signal according to claim 12, wherein the clamping voltage used in the clamping step is the grounded voltage.

\* \* \* \* \*